US012484352B2

(12) United States Patent
Ben Bakir et al.

(10) Patent No.: US 12,484,352 B2
(45) Date of Patent: Nov. 25, 2025

(54) LIGHT EMITTING DEVICE, PIXEL COMPRISING SEVERAL SUCH DEVICES, MATRIX OF PIXELS AND ASSOCIATED MANUFACTURING METHODS

(71) Applicant: COMMISSARIAT À L'ENERGIE ATOMIQUE ET AUX ENERGIES ALTERNATIVES, Paris (FR)

(72) Inventors: Badhise Ben Bakir, Grenoble (FR); Adrien Gasse, Grenoble (FR); Gilles Le Blevennec, Grenoble (FR); Nicolas Olivier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 642 days.

(21) Appl. No.: 17/342,105

(22) Filed: Jun. 8, 2021

(65) Prior Publication Data
US 2021/0391497 A1 Dec. 16, 2021

(30) Foreign Application Priority Data

Jun. 12, 2020 (FR) ........................................ 2006161

(51) Int. Cl.
*H10H 20/856* (2025.01)
*H01L 25/16* (2023.01)
(Continued)

(52) U.S. Cl.
CPC ......... *H10H 20/856* (2025.01); *H01L 25/167* (2013.01); *H10H 20/01* (2025.01);
(Continued)

(58) Field of Classification Search
CPC ..... H01L 33/505; H01L 33/502; H01L 33/06; H01L 33/22; H01L 33/32;
(Continued)

(56) References Cited

U.S. PATENT DOCUMENTS

2014/0299854 A1* 10/2014 Mizuno ................ H10K 50/858
257/40
2017/0284609 A1* 10/2017 Hirasawa ................ H01L 33/54
2018/0047780 A1* 2/2018 Yeon ...................... H01L 27/156

FOREIGN PATENT DOCUMENTS

| EP | 2 423 736 A1 | 2/2012 |
| EP | 3 024 030 A1 | 5/2016 |
| FR | 3 061 605 A1 | 7/2018 |
| WO | WO 2018/084919 A1 | 5/2018 |

(Continued)

OTHER PUBLICATIONS

Extended European Search Report as issued in European Patent Application No. 21177529.1, dated Nov. 30, 2021.
Search Report as issued in French Patent Application No. 2006161, dated Feb. 24, 2021.

(Continued)

*Primary Examiner* — Feifei Yeung Lopez
(74) *Attorney, Agent, or Firm* — Pillsbury Winthrop Shaw Pittman LLP

(57) ABSTRACT

An optoelectronic light emitting device includes a light emitting diode configured to emit a first radiation, a conversion layer including at least one planar quantum well configured to convert the first radiation into a second radiation, by photoluminescence, a grating for extracting the second radiation being etched on an upper face of the layer, and a lateral reflector having a reflective surface which extends facing part at least of a lateral surface of the conversion layer.

17 Claims, 10 Drawing Sheets

(51) Int. Cl.
  *H10H 20/01* (2025.01)
  *H10H 20/812* (2025.01)
  *H10H 20/814* (2025.01)
  *H10H 29/14* (2025.01)

(52) U.S. Cl.
  CPC ........ *H10H 20/812* (2025.01); *H10H 20/814* (2025.01); *H10H 29/142* (2025.01); *H10H 20/0362* (2025.01); *H10H 20/0363* (2025.01)

(58) Field of Classification Search
  CPC ......... H01L 2933/0083; H01L 33/0008; H01L 33/10; H01L 33/60; H01L 27/156; H01L 2933/0058
  See application file for complete search history.

(56) References Cited

FOREIGN PATENT DOCUMENTS

| WO | WO2018084919 | * | 5/2018 |
| WO | WO2018122357 | * | 7/2018 |

OTHER PUBLICATIONS

Santos, J. M. M., et al., "Hybrid GaN LED with capillary-bonded II-VI MQW color-converting membrane for visible light communications," Semiconductor Science and Technology, IOP Publishing, vol. 30. No. 3, Jan. 2015, 7 pages.

Chen, G.-S., et al., "Monolithic Red/Green/Blue Micro-LEDs With HBR and DBR Structures," IEEE Photonics Technology Letters, vol. 30, No. 3, Feb. 2018, pp. 262-265.

* cited by examiner

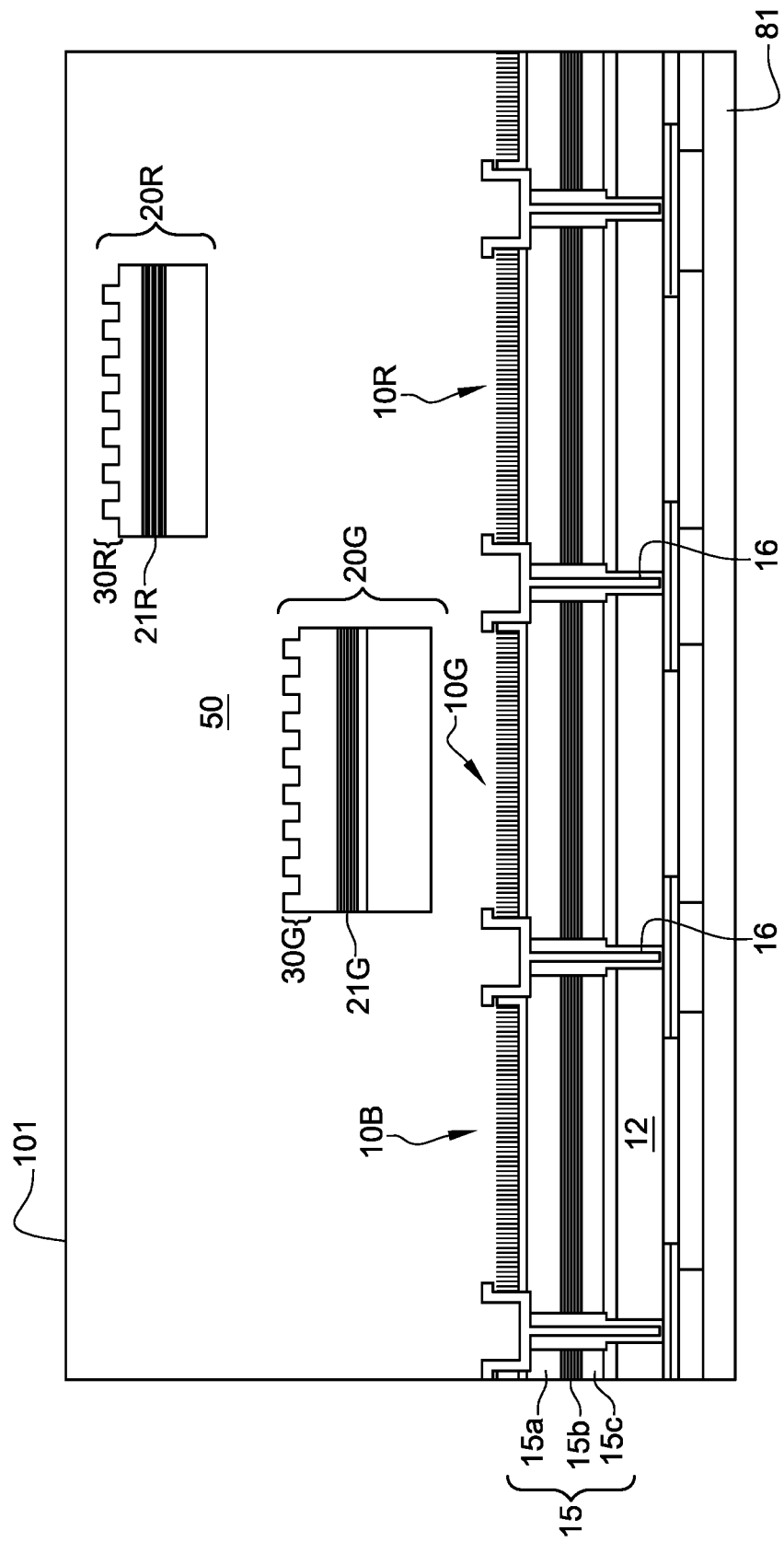

LIGHT EMITTING DEVICE, PIXEL COMPRISING SEVERAL SUCH DEVICES, MATRIX OF PIXELS AND ASSOCIATED MANUFACTURING METHODS

CROSS-REFERENCE TO RELATED APPLICATIONS

This application claims priority to French Patent Application No. 2006161, filed Jun. 12, 2020, the entire content of which is incorporated herein by reference in its entirety.

FIELD

The present invention concerns an optoelectronic light emitting device, a pixel comprising a plurality of optoelectronic light emitting devices, a display comprising a matrix of such pixels, and manufacturing methods thereof.

BACKGROUND

Generally speaking, an important parameter for display devices is to have the largest "gamut" possible. In colour synthesis, whether additive or subtractive, the gamut or range of colours is the part of the set of colours that a certain type of material or equipment makes it possible to reproduce. Furthermore, lighting and display devices are continuously evolving by increasing the luminous flux and the definition (that is to say the resolution) of emissive surfaces. For screens for example, this is reflected by the passage from cathode ray tubes to liquid crystal screens and now OLED (organic light emitting diode) screens. For lighting, it involves for example the passage from incandescent light bulbs to LEDs (light emitting diodes).

The use of a matrix of LEDs for display or lighting purposes (for example for headlights, in the automobile industry) requires adapting the technology of LEDs to semiconductors, for example made of gallium nitride GaN, with pixelized matrix emission. Semiconductor technology indeed enables the manufacture of matrices with pixels extending from a micrometre to several tens of micrometres. But LEDs with gallium nitride GaN mainly emit blue light, in a range of wavelengths situated around 460 nm.

To obtain other colours, it is necessary to carry out a light conversion operation at the pixel scale. Since blue light is the most energetic of the visible spectrum, it may be converted by photoluminescence into less energetic green or red light. Photoluminescence is a process by which a substance is excited by absorbing photons, then is de-excited by re-emitting photons of lower energy. There are two forms of photoluminescence: fluorescence and phosphorescence. Fluorescence is fast photoluminescence whereas phosphorescence is slow photoluminescence: it is fluorescence that is suitable for display and lighting applications.

Fluorescence may be obtained by means of fluorophores, being for example in the form of powders associated with a polymer matrix.

These fluorophores must be of submicronic dimensions, so that it is possible to confine them in pixels of a few microns. The materials currently available are 3D quantum dots of semiconductors such as cadmium selenide CdSe, indium phosphide InP or silver indium sulphide $AgInS_2$, or nanophosphors of oxide, such as YAG:Ce (yttrium aluminium garnet doped with cerium) sulphide or fluoride.

Furthermore, a constraint of photo-conversion applied to micro-pixels is the additional thickness that it requires, which for technical reasons, related in particular to the aspect ratio of the structure, must remain of the order of the size of the pixels; for 3 μm pixels for example, the conversion thickness must remain of the order of 3 μm maximum; or 10 μm maximum for 10 μm pixels. Independently of the size of the pixels, table 1 below shows the conversion thickness required to absorb blue light at 460 nm, respectively fora 3D quantum dot of indium phosphide InP or cadmium selenide CdSe or for a LuAG:Ce (lutetium aluminium garnet doped with cerium) nanophosphor, and for different fluorophore volume loading rates in the composite. Table 2 below shows for its part the percentage absorption reached for the different fluorophores and loading rates of table 1.

TABLE 1

| Volume load rate (%) | InP | CdSe | LuAG:Ce |
|---|---|---|---|
| 10 | 8 μm | 5 μm | 150 μm |
| 20 | 3 μm | 2.5 μm | 90 μm |
| 30 | 1.2 μm | 1.2 μm | 50 μm |

TABLE 2

| Volume load rate (%) | InP | CdSe | LuAG:Ce |
|---|---|---|---|
| 10 | 96 | 94 | 94 |
| 20 | 98 | 96 | 95 |
| 30 | 99 | 97 | 95 |

Generally speaking, nanophosphors such as LuAG:Ce require a conversion thickness of several tens of microns to absorb blue totally or virtually totally, which is not compatible with pixel sizes below 10 μm.

3D quantum dots thus appear more promising than nanophosphors, since the thickness required for efficient conversion is far smaller than in the case of nanophosphors.

The article "Monolithic red/green/blue micro-LEDs with HBR and DBR structures", of Guan-Syun Chen et al., IEEE Photonics Technology Letters, Vol. 30, No. 3, 1 Feb. 2018, furthermore describes a pixel comprising three gallium nitride light emitting diodes: a first without conversion layer for the emission of blue light, a second with conversion layer for the emission of red light and a third with conversion layer for the emission of green light. The fluorophores used are 3D quantum dots. The three diodes are separated from one another at the level of their active layer, and at the level of their conversion layer if appropriate, by a light radiation absorption layer, in order to limit crosstalk to improve the purity and the contrast of the colours. A lower Bragg mirror, arranged under the substrate, is configured to reflect the three colours. An upper Bragg mirror is arranged on the conversion layers of the second and third diodes in order to block blue light.

3D quantum dots, such as those employed in the article in question suffer from a notable lack of stability when they are subjected to a light flux or heat, which is the case in display or lighting devices. Encapsulation solutions exist but which only enable weak luminosity and low resolution.

In this context, there thus exists a need for an optoelectronic device, robust, capable of emitting light radiation having a colour different from blue in a stable manner and with good efficiency, and to do so even if the device is of micronic dimensions. There also exists a need for a pixel comprising several such optoelectronic devices, emitting radiations having different saturated colours, to enable a colour display.

SUMMARY

To resolve at least in part the aforementioned problems, an optoelectronic light emitting device is proposed comprising:
- a light emitting diode configured to emit a first radiation, and
- a conversion layer which extends above the light emitting diode and which is configured to convert a part at least of the first radiation into a second radiation, by photoluminescence, the conversion layer being delimited laterally by a lateral surface, and wherein:
- the conversion layer comprises at least one planar quantum well configured to emit the second radiation,
- a diffraction grating, configured to extract a part at least of the second radiation from the conversion layer, the diffraction grating being etched on an upper face of the conversion layer,
- a lateral reflector having a reflective surface which extends transversally with respect to the conversion layer, facing a part at least of the lateral surface of the conversion layer;
- the reflective surface of the reflector and the lateral surface of the conversion layer being separated from each other by a material having an optical index $n_2$, and wherein a distance separating the reflective surface of the reflector of the lateral surface from the conversion layer is comprised between $\lambda/(n_2 \times 40)$ and $\lambda/(n_2 \times 2)$ where $\lambda$ is the average wavelength of the second radiation.

Converting the first radiation by photoluminescence by means of a planar quantum well makes it possible to reduce the aforementioned absorption thickness problems, encountered with nanophosphors.

Indeed, a thickness of the conversion layer typically comprised between 0.1 and 1 micron generally proves sufficient to absorb the major part of the first radiation in the conversion layer (made of semiconductor), and thus enable the emission of the second radiation, by radiative recombination in the quantum well. As an example, in the case where the first radiation has a spectrum situated mainly in the blue, for example in a range of wavelengths comprised between 430 and 490 nanometres, and where the second radiation has a spectrum situated mainly in the red, for example in a range of wavelengths situated between 600 and 700 nanometres, for a planar quantum well conversion layer of AlInGaP/InGaP (aluminium indium gallium phosphide/indium gallium phosphide) type, a thickness comprised between 0.2 and 0.5 microns makes it possible to absorb the major part of the first radiation.

Furthermore, planar quantum well structures do not suffer from the lack of stability of 3D quantum dots. Such planar quantum well structures indeed have very good flux and temperature resistance because they are generally produced by epitaxy at high temperature.

On the other hand, in the absence of particular arrangements, the luminous power finally emitted by a planar quantum well conversion layer may prove to be relatively weak, an important part of the second radiation remaining as it were trapped in this layer, by total internal reflection, on account of the high optical index value of the materials forming this layer (generally of the order of 3 or more).

The aforementioned diffraction grating, which forms a mono- or two-dimensional photonic crystal, allows a greater part of the second radiation to come out of the conversion layer, to next propagate to the outside of the device. In other words, this grating improves the extraction efficiency of the second radiation. It further makes it possible to impose a direction of propagation and/or a given intensity profile and/or a given polarisation to the radiation finally coming out of the optoelectronic device, in order to adapt it to the targeted applications.

The lateral reflector cooperates with the diffraction grating to further improve the efficiency with which the second radiation is extracted from the conversion layer. Indeed, a part of the second radiation, which propagates in the conversion layer parallel to its upper face, in the form of a guided propagation mode, finishes by coming out of the conversion layer at the level of the lateral surface which laterally delimits this layer. But the reflector then sends back this part of the second radiation to the conversion layer, where it can once again propagate, parallel to the upper face of the layer. The reflector thus makes it possible to increase the length over which this propagation mode interacts with the diffraction grating, thus improving the extraction efficiency for the second radiation.

From an optical viewpoint, the lateral reflector thus makes it possible to somehow de-multiply the diffraction grating and to give it an effective length greater than its actual geometric length. Thanks to this reflector, the extraction efficiency of the grating is the same, or almost the same as that of an "effective" diffraction grating which would have a greater lateral extension than that of the diffraction grating etched on the conversion layer (typically, at least two times greater taking into account a lateral mirror with degraded reflectivity, but this "effective" diffraction may tend towards infinity with an ideal lateral mirror with a reflectivity close to 100%).

This proves to be particularly interesting when the light emitting device has micronic lateral dimensions, for example of the order of ten microns or so. Indeed, the diffraction grating etched on the upper face of the conversion layer then only comprises a limited number of patterns repeated periodically, for example ten or so patterns in the case of a 1D grating, which leads to limited extraction efficiency. Further, when the device has micronic lateral dimensions, the thickness of the different layers of the device is also reduced (the device then also having a micronic thickness), with the result that an etching of a grating of important depth is generally not possible, or not desirable. This reduced etching depth also tends to limit the extraction efficiency.

Digital simulation results moreover show that for an emission device without the lateral reflector, a diffraction grating 50 to 80 microns long, or even more, is necessary to extract the major part of the second radiation.

And, as an example, for a 1D grating of 6 microns sides only, comprising 7 repetitions of the grating pattern, configured to extract a radiation of which the average wavelength is 640 nanometres (wavelength in a vacuum), these digital simulations show that the far field extraction efficiency is only around 15% in the absence of the lateral reflector. Whereas in the presence of the lateral reflector, in the case where the reflector extends all around the grating, this same grating (of 6 microns sides) makes it possible to obtain a far field extraction efficiency of 80%.

Furthermore, maintaining a gap between the conversion layer and the reflective surface beneficially makes it possible to avoid plasmonic coupling with the metal of the reflector, when this reflective surface is metallic (coupling which would cause power losses).

Besides, the fact that the distance between the conversion layer and the reflective surface is less than $\lambda/(n_2 \times 2)$, enables, from an optical viewpoint, to avoid a too large discontinuity between the grating itself and its image by the reflective surface. In other words, this enables to obtain an effective optical grating close to a regular grating period, without discontinuity between the actual grating and its different replication or replications by the reflective surface. This is interesting, because the extraction efficiency of an extended and regular "effective" grating is better than that of an extended effective grating with discontinuities between each replication of the initial grating.

The reflective surface of the reflector may extend around the conversion layer, over the major part of the perimeter of the conversion layer, or even over the totality of the perimeter of the conversion layer. The reflective surface then extends not only in face of a part of the lateral surface of the conversion layer, but all around this lateral surface, or almost all around it. The perimeter of the conversion layer designates a line which surrounds this conversion layer laterally, while edging it. The fact that the reflective surface of the reflector extends around the conversion layer over the major part of the perimeter of this layer signifies that the reflective surface of the reflector extends opposite one or more parts of the lateral surface of the conversion layer, this or these parts extending, around the conversion layer, over a total length (length which is potentially a cumulative length) greater than half of the length of said perimeter (that is to say over a total length with represents the major part of the length of said perimeter). As an example, if the conversion layer has a square section of side c, its perimeter has a length equal to 4c, and the reflective surface of the reflector then extends opposite one or more parts of the lateral surface of this layer that occupy, around this layer, a length greater than 2c.

This arrangement enables to further increase the "effective" dimensions of the diffraction grating, by allowing the second radiation to travel back and forth several times in the conversion layer since the reflector then confines the second radiation laterally in the conversion layer.

The reflective surface of the reflector may also comprise at least a first reflective face and a second reflective face, each reflective face extending transversally with respect to the conversion layer, facing a part of the lateral surface of the conversion layer, the second reflective face being situated opposite the first reflective face with respect to the conversion layer, the first and second reflective faces being substantially parallel with each other.

This arrangement enables, in a simple manner, by successive reflections on the reflective faces in question, the second radiation to travel back and forth many times in the conversion layer. This arrangement thus enables to obtain an effective grating length far greater than its "actual" geometric length (not only two times greater, but even 10, or even 20 times greater, thanks to this large number of back and forth journeys), in a simple manner.

Apart from the aforementioned characteristics, the optoelectronic device which has been described may comprise one or more of the following complementary and non-limiting characteristics, considered individually or according to all technically possible combinations:

the reflector is formed, at least superficially, of a metal;
the upper face of the conversion layer extends onto an area less than 1000 microns square, or even less than 100 microns square or even less than 10 microns square;
the light emitting diode comprises an active layer from where is emitted the first radiation and the device further comprises a lateral confinement system which includes said lateral reflector, which extends axially from the active layer to the conversion layer and which is configured to confine the first radiation laterally;
the device further comprises a first multilayer reflective filter which extends between the light emitting diode and the planar quantum well and which is at least partially reflective for the second radiation;
the device further comprises a second multilayer reflective filter which extends above the planar quantum well and which is at least partially reflective for the first radiation.

Another aspect of the invention relates to a pixel comprising:
an optoelectronic device such as described above, and
an additional optoelectronic light emitting device comprising:
an additional light emitting diode, configured to emit said first radiation,
an additional conversion layer which extends above the additional light emitting diode and which is configured to convert a part at least of the first radiation into a third radiation, by photoluminescence, the additional conversion layer being delimited laterally by a lateral surface, the additional conversion layer comprising at least one additional planar quantum well configured to emit the third radiation, an additional diffraction grating, configured to extract a part at least of the third radiation from the additional conversion layer, the additional diffraction grating being etched on an upper face of the additional conversion layer, and
an additional lateral reflector having a reflective surface of which a part at least extends transversally with respect to the additional conversion layer, facing the lateral surface of the additional conversion layer.

An aspect of the invention also relates to a pixel, such as described above, further comprising another optoelectronic light emitting device which comprises another light emitting diode configured to emit said first radiation and which is:
either with no conversion layer,
or provided with an additional conversion layer, configured to convert a part at least of the first radiation into a fourth radiation different from the second and third radiations.

An aspect of the invention also relates to a display comprising a matrix of pixels such as described above.

An aspect of the invention also relates to a method for manufacturing an optoelectronic light emitting device, comprising the following steps:
producing a light emitting diode configured to emit a first radiation;
producing a conversion layer, which extends above the light emitting diode and which is configured to convert a part at least of the first radiation into a second radiation, by photoluminescence, the conversion layer being delimited laterally by a lateral surface;
wherein the step of producing the conversion layer comprises a step of producing a planar quantum well configured to emit the second radiation, the method further comprising the following steps:
  etching a diffraction grating on an upper face of the conversion layer, the diffraction grating being configured to extract a part at least of the second radiation of the conversion layer, and
  producing a lateral reflector having a reflective surface which extends transversally with respect to the conversion layer, facing a part at least of the lateral surface of the conversion layer, the reflective surface of the reflector and the lateral surface of the conversion layer being separated from each other by a material having an optical index $n_2$, and wherein a distance separating the reflective surface of the reflector from the lateral surface of the conversion layer is comprised between $\lambda/(n_2 \times 40)$ and $\lambda/(n_2 \times 2)$ where $\lambda$ is the average wavelength of the second radiation.

In this method, the light emitting diode may be produced on a first substrate, the method further comprising an encapsulation of the light emitting diode and a planarization of a contact surface situated above the light emitting diode, and that the step of producing the conversion layer comprises the following steps:
  on a second substrate, producing a stack comprising said planar quantum well,
  placing said stack on said contact surface, in contact with said contact surface, and fixing said stack onto the contact surface, and
  removing the second substrate.

The method described above may further be carried out in such a way that the device produced comprises one or more of the optional characteristics described above, when presenting the device.

An aspect of the invention also relates to a method for manufacturing a pixel, comprising the following steps:
  producing a first, second and third light emitting diodes, each configured to emit a first radiation,
  producing a conversion layer, which extends above the third light emitting diode and which is configured to convert a part at least of the first radiation into a third radiation, by photoluminescence, the conversion layer being delimited laterally by a lateral surface, said production step comprising:
    a step of producing at least one planar quantum well configured to emit the third radiation, and
    a step of etching a diffraction grating on an upper face of the conversion layer, the diffraction grating being configured to extract a part at least of the third radiation from the conversion layer,
  producing a conversion layer, which extends above the second light emitting diode and which is configured to convert a part at least of the first radiation into a second radiation, by photoluminescence, the conversion layer being delimited laterally by a lateral surface, said production step comprising:
    a step of producing at least one planar quantum well configured to emit the second radiation, and
    a step of etching a diffraction grating on an upper face of the conversion layer, the diffraction grating being configured to extract a part at least of the second radiation from the conversion layer,
  for each conversion layer, producing a lateral reflector having a reflective surface which extends transversally with respect to the conversion layer considered, facing a part at least of the lateral surface of this conversion layer, the reflective surface of the reflector and the lateral surface of the conversion layer considered being separated from each other by a material having an optical index $n_2$, and wherein a distance separating the reflective surface of the reflector from the lateral surface of the conversion layer considered is comprised between $\lambda/(n_2 \times 40)$ and $\lambda/(n_2 \times 2)$ where $\lambda$ is the average wavelength of the second radiation, or, respectively of the third radiation.

The invention and the different applications thereof will be better understood on reading the description that follows and by examining the figures that accompany it.

BRIEF DESCRIPTION OF THE FIGURES

The figures are presented for indicative purposes and in no way limit the invention.

FIG. 14 schematically represents the pixel of FIG. 1, just after a step of producing another conversion layer, in section and side view.

DETAILED DESCRIPTION

Within the scope of the present document, the terms "light emitting diode", and "LED" are employed indiscriminately.

An aspect of the invention relates in particular to an optoelectronic light emitting device 1R, 1G comprising (FIG. 1):
  an electrically pumped light emitting diode, 10R, 10G, configured to emit a first light radiation of which the spectrum extends mainly in a given band of wavelengths, for example between 400 and 490 nanometres, and which has for example a colour corresponding to a blue, and
  a conversion layer 20R, 20G, which extends above the light emitting diode 10R, 10G and which is configured to convert a part at least of the first radiation, by photoluminescence, in such a way as to obtain another light radiation, having for example a red or green colour.

Figure 1:
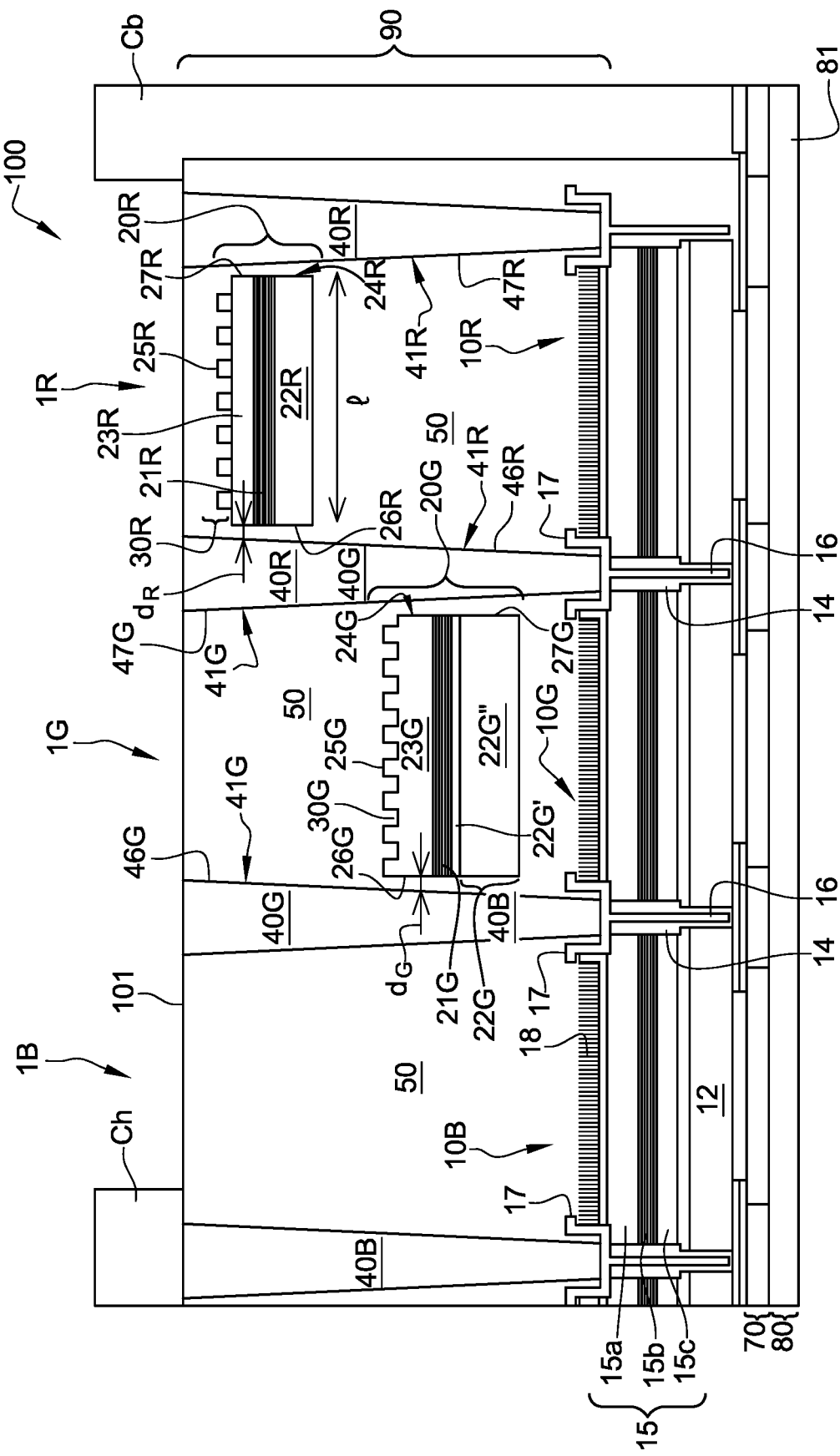
FIG. 1 schematically represents a pixel implementing the teachings of an aspect of the invention, in section and side view.

Such an optoelectronic device 10R, 10G finds a particularly interesting application in the production of a "colour" pixel 100, such as that represented in FIG. 1, capable of emitting an overall light radiation of which the colour may be adjusted electrically.

To produce such a pixel 100, it is possible for example to group together:
- a first optoelectronic light emitting device, 1B, comprising an electrically pumped LED 10B, configured to emit the aforementioned first light radiation (this first radiation having in this particular instance a colour corresponding to a blue), the first device 1B being without conversion layer,
- a second optoelectronic light emitting device, 1R, such as described above, the conversion layer 20R of this device 1R being configured to emit a second light radiation, by photoluminescence, the second light radiation having for example a colour corresponding to a red and a spectrum situated mainly between 590 and 700 nanometres, and
- a third optoelectronic light emitting device 1G, such as described above, the conversion layer 20G of this device 1G being configured to emit a third light radiation, by photoluminescence, the third light radiation having for example a colour corresponding to a green and a spectrum situated mainly between 490 and 590 nanometres.

Such a "colour" pixel, based on three "blue" light emitting diodes 10B, 10R, 10G of which two are provided with a conversion layer 20R, 20G, is particularly interesting because the manufacture of "blue" light emitting diodes is today well mastered, and because their luminous efficiency is high. Further, in this arrangement, only two conversion layers are used to produce three radiations having distinct colours, in this particular instance a red, a green and a blue (which makes it possible, for the overall radiation emitted, which corresponds to the combination of these three radiations, to obtain a colour that is adjustable within a wide range of colours).

In an alternative, the ranges of wavelengths employed, and the structure of the pixel, could however be different from those described above.

For example, the electrically pumped LEDs 10R, 10B and 10G could be configured in such a way that the first radiation that they emit is situated in the near ultraviolet (in which case the first device could also for be provided with a conversion layer), instead of being situated in the visible. Or instead, they could be configured in such a way that the colour of the first radiation corresponds to a violet instead of corresponding to a blue.

Furthermore, the pixel could comprise a number of elementary light emitting devices different from three. It could for example comprise, in addition to the aforementioned three emission devices, a fourth emission device configured to emit in the red, of the same type as the second device 1R (the pixel then comprising two devices for emission in the red, one device for emission in the blue, and one device for emission in the green). Conversely, the pixel could comprise only two light emitting devices, for example one for emission in the red and one for emission in the blue. Generally speaking, it is possible to provide another number of sub-pixels (per pixel) than has been indicated above, other emission wavelengths and/or other forms of replication of sub-pixels within a same pixel. A set of sub-pixels forms a pixel which may be replicated several times to form a matrix.

Furthermore, even if the individual light emitting devices 1R and 1G are grouped together here to form colour pixels 100, each of these emitting devices 1R, 1G may be considered alone, and could furthermore be employed alone to obtain a light source. The pixel 100 for its part may also be considered alone, and be employed alone to produce an elementary colour light source (in other words, it is not necessarily integrated in a matrix of pixels).

A colour display capable of generating, that is to say displaying, a colour image may be produced by grouping together several pixels such as the pixel 100 described above. These pixels 100 are then grouped together in the form of a matrix of pixels.

A monochrome display could however also be produced, by grouping together in the form of a matrix several identical emission devices, such as the device 1R, or such as the device 1G.

The structure of the pixel 100 will now be described in greater detail, with reference to FIGS. 1 to 6. A method for manufacturing such a pixel, and, more generally, for manufacturing a display comprising a matrix of pixels 100 of this type, will next be described, with reference to FIGS. 7 to 14.

The pixel 100, and more generally the display which groups together several pixels 100 of this type, comprises a conversion stack 90, which extends above the electrically pumped LEDs 10R, 10G, 10B (above the "blue" LEDs), and which includes the aforementioned conversion layers 20R, 20G (FIG. 1). This conversion stack 90 has a remarkable structure, which enables particularly efficient photoluminescence conversion (here into green light, and into red light).

The lower part of the pixel 100, which comprises the electrically pumped LEDs 10R, 10G, 10B ("blue" LEDs), will be described firstly, and this particular conversion stack 90 will next be described.

The first, second and third electrically pumped LEDs 10B, 10R, 10G are here identical, or at least similar to each other. They are arranged on an interconnection stack 70, which makes it possible to electrically supply them in a selective manner, that is to say independently of one another. The interconnection stack is itself arranged on an integrated control circuit 80.

Here, each electrically pumped LED 10B, 10R and 10G comprises an active layer 15 which comprises one or more planar quantum wells, for the emission of the first radiation.

The active layer 15 may, as here, be formed by a stack comprising, in this order, from top to bottom:
- a layer 15a of N type doped gallium nitride,
- an emissive layer 15b, which comprises the aforementioned planar quantum well or wells, and
- a layer 15c of P type doped gallium nitride.

This stack is deposited on a metal anode contact layer, 12. The metal layer 12 thus extends under the layer 15c of P type doped gallium nitride, in electrical contact therewith.

The emission of the first radiation is obtained by injecting an electric current into the LED 10B, 10R, 10G, this current then traversing the active layer 15 from the anode region of this heterojunction, formed by the layer 105c, to its cathode region, formed by the layer 105a.

The expression "planar quantum well", or more simply "quantum well", here designates a structure comprising:
- a thin, central layer, formed of a first semiconductor material having a first band gap, and
- two barrier layers which enclose the central layer, each barrier layer being formed of a second semiconductor material having a second band gap wider than the first band gap (the two barrier layers potentially could be formed respectively of two semiconductor materials different from one another), or, instead of the two barrier layers, a solid semiconductor material which encloses the central layer and which has a band gap wider than the first band gap.

The thin, central layer forms a potential well for electrons and/or holes (which explains the denomination of "quantum well" given to this structure). This well is planar in the sense that it extends in a plane, in a two-dimensional manner, since the central layer is itself planar. The thin, central layer has a thickness which is typically comprised between 3 and 15 nanometres. Its thickness is far smaller than its lateral dimensions, parallel to the plane of the layer (width and length).

The quantum well or wells of the emissive layer 15b are configured in such a way as to emit the first aforementioned radiation, that is to say, here, in such a way as to emit a light radiation of which the spectrum is contained mainly in the band of wavelengths which extends from 400 nanometres to 490 nanometres. It is more precisely the thickness of the central layer of each of these wells and the first semiconductor material which forms this central layer that are chosen in such a way that the first radiation has the desired spectrum. To obtain like here an emission in the blue, it is possible for example to choose, for the first semiconductor material (central layer), indium gallium nitride InGaN, the second semiconductor material being for its part gallium nitride GaN.

The semiconductor materials chosen could however be different, in particular if it is sought to emit the first light radiation in a range of wavelengths different from that indicated above (different from the range extending from 400 to 490 nm).

Thus, when it is wished more generally to obtain an emission in a given range of wavelengths of the visible domain (380 to 700 nm), the active layer 15 could be based on III-V semiconductor materials, that is to say comprising an element of column V of the periodic table of elements, for example nitrogen N, arsenic As or phosphorous P, associated with one or more elements of column III of the periodic table of elements, for example gallium Ga, aluminium Al and/or indium In. III-V semiconductor materials are thus, for example, gallium nitride GaN, indium nitride InN, aluminium nitride AlN, gallium phosphide GaP, indium phosphide InP, indium gallium nitride InGaN, aluminium gallium nitride AlGaN, indium gallium nitride InGaN, aluminium gallium phosphide AlGaP, aluminium indium gallium phosphide AlInGaP, indium gallium aluminium nitride InGaAlN. In an alternative, the first semiconductor material, which forms the central layer of the quantum well or wells, could thus be chosen from the following materials: GaN, InP, AlGaN, AlN, AlInGaN, GaP, AlGaP, InGaP, AlInGaP, GaAs, or AlGaAsN which are binary, ternary or quaternary compounds of these III-V elements.

The characteristics of the emissive layer 15b may furthermore be chosen in such a way that the spectrum of the first light radiation emitted has a width at half maximum less than a given threshold, for example less than 30 nm.

In the example represented, each electrically pumped LED, 10R, 10G, 10B, comprises a textured upper layer 18, for example made of etched semiconductor, which extends above the cathode layer 15a, against it. This textured layer forms a photonic crystal which constitutes a diffraction grating improving the efficiency with which the first radiation is extracted from the corresponding LED.

In the example represented, the different LEDs 10R, 10G, 10B of the pixel 100, and more generally of the display, are separated from one another by substantially vertical trenches (that is to say substantially perpendicular to the plane of the active layer 15 of the LEDs). These trenches are produced in a stack of layers (in this particular instance the layers 12 and 15a to 15c), which, initially, is all in one piece, with a very large lateral extension. This stack is as it were cut into islands by these trenches to delimit a plurality of islands or mesas corresponding to the different LEDs of the pixel 100 (or more generally, of the display).

In the example represented, these trenches completely traverse the layers 12, 15c, 15b and 15a of the stack. The lateral faces of the trenches are clad with an insulator layer 14, for example made of silicon oxide. The lateral faces of each LED 10R, 10G, 10B are thus clad with this insulator layer 14, here made of silicon oxide. The trenches are next filled with a metal which forms a lateral wall 16 which optically isolates the LEDs from one another. For each LED, this lateral wall 16 laterally confines the first radiation emitted by the LED, which avoids this radiation propagating to a neighbouring LED. This thus reduces crosstalk between neighbouring LEDs, crosstalk which would affect the purity of the red or the green produced by the second and third devices 1R, 1G of the pixel 100.

As represented, the lateral metal wall 16 extends vertically over the whole height of the LED, from the bottom of the metal contact layer 12 to the upper part of the cathode layer 15a. In an alternative, this lateral wall could however extend only from a lower face of the active layer 15 to an upper face of this layer, for example. This arrangement in fact also makes it possible to confine laterally the radiation produced by the considered LED.

A contact pick-up element 17, in contact with the lateral metal wall 16, is produced on the top of the trench. This element, electrically conductive, has the form of a U-shaped channel, here, open on its upper side. It is in electrical contact with the layer 15a of N type doped gallium nitride.

As already mentioned, the LEDs 10R, 10G, 10B are here produced on an interconnection stack 70. This stack typically comprises one or more insulator layers, one or more metal layers, and one or more levels of conductive vias.

The integrated control circuit 80 is typically formed in and on a semiconductor substrate 81, for example a silicon substrate. The control circuit 80 comprises for example, for each LED, an elementary control cell (not detailed), electrically connected to the contact layer 12 of the LED and comprising one or more transistors making it possible to control the current circulating in the LED and/or the voltage applied to the LED. The control circuit 80 is for example produced using CMOS technology.

The cathodes of the different LEDs 10R, 10G, 10B (more precisely their cathode layers 15a) may be in electrical contact with each other, directly, that is to say through only one or more metal conductors, and are each electrically connected, directly to a common contact Ch forming an electrical contact pad (FIG. 1). In other words, the different LEDs 10R, 10G, 10B may have, from an electrical viewpoint, common cathodes.

In an alternative, the different LEDs of the display could be arranged differently with respect to each other. And another contact system could be employed. Thus, it could be provided for example that the anodes of the different LEDs (more precisely their anode layers) are in electrical contact with each other, directly, and are electrically connected, directly to a common contact Cb forming an electrical supply pad (these different LEDs then having, from an electrical viewpoint, common anodes).

It will be noted that the pixels 100 of this display are pixels of small dimensions. Indeed, for each of these pixels, the optoelectronic light emitting devices 1R, 1G and 1B each occupy a surface less than 3000 microns$^2$ (3000 microns square), or even less than 1000 microns$^2$ or even less than 100 microns$^2$.

Each of these emission devices thus has a reduced emission surface. It is thus possible to provide, for example, that each of these devices 1R, 1G, 1B has dimensions (for example a width, a length, or a diameter), in a plane parallel to the median plane of the pixel (that is to say parallel to the plane of the substrate 81 on which the light emitting diodes are produced) which are each less than 30 microns, or even less than 10 microns or even less than 6 microns. Each of these devices may for example occupy, on the substrate 81, a square surface of 20, 10 or 6 microns sides (as in the case of FIG. 3), or even less. Each of these devices could also, for example, occupy a rectangular surface 10 microns wide and 30 microns long (or less), or instead 6 microns wide and 15 microns long, for example. The invention furthermore applies in a particularly interesting manner to devices of particularly small dimensions, for example devices of 3 microns sides or less.

The conversion stack 90 will now be described in greater detail.

This stack comprises:
the aforementioned conversion layer 20R (conversion layer to red), situated above the LED 10R of the second emission device 1R, in line with this LED, and
the conversion layer 20G (conversion layer to green), situated above the LED 10G of the third emission device 1G, in line with this LED.

The conversion layer 20R of the second emission device 1R is formed by a stack of layers made of semiconductor material. The lateral extension of this stack, that is to say the surface that it occupies in a plane parallel to the median plane of the pixel 100, is limited and coincides substantially with the lateral extension of the electrically pumped LED 10R. Put another way, the conversion layer 20R covers the LED 10R but does not cover the other LEDs 10B, 10G of the pixel 100. The lateral surface of the conversion layer 20R, which laterally delimits this layer, is marked by the reference 24R.

In a comparable manner, the conversion layer 20G of the third emission device 1G is formed by a stack of layers made of semiconductor material, of which the lateral extension is limited to the lateral extension of the LED 10G. The lateral surface of the conversion layer 20G, which laterally delimits this layer, is marked by the reference 24G.

The conversion layer 20R does not extend directly in contact with the LED 10R. The conversion layer 20R is on the other hand separated from the upper face of the LED 10R by a certain distance, axially (that is to say in a direction perpendicular to the median plane of the pixel 100). The space situated between the LED 10R and the conversion layer 20R is filled by a transparent filling material 50, for example silicon oxide SiO$_2$. This filling material 50 also covers the conversion layer 20R and surrounds it laterally. The conversion layer 20R is thus embedded in the filling material 50, here.

In the same way, the conversion layer 20G is separated from the upper face of the LED 10G by a certain distance, axially, and the space situated between the LED 10G and the conversion layer 20G is filled by the filling material 50. The conversion layer 20G is for its part also embedded, that is to say encompassed, in the filling material 50.

The structure of the conversion layers 20R, 20G will now be described in greater detail.

The conversion layer 20R of the second device 1R comprises at least one planar quantum well 21R, configured to emit the second radiation (radiation situated here in the range of wavelengths extending from 600 to 700 nm). The semiconductor materials employed to produce this or these quantum wells may for example be aluminium indium gallium phosphide AlInGaP and indium gallium phosphide InGaP.

The quantum well 21R of this layer 20R, or the set of quantum wells 21R of this layer, is enclosed between a lower layer 22R and an upper layer 23R, which form a sort of cladding for the quantum well or wells. Each of these layers 22R, 23R is made for example of aluminium indium gallium phosphide, AlInGaP.

The lower layer 22R, situated below the quantum well or wells 21R, is thus intercalated between the LED 10R and this or these wells 21R. The lower layer 22R has for example a thickness comprised between 0.1 and 0.5 microns. The upper layer 23R may also have a thickness comprised between 0.1 and 0.5 microns, for example.

In practice, the number of quantum wells 21R is typically comprised between 1 and 5. It will be noted in this respect that for the conversion of blue to red, a single quantum well may prove to be sufficient to convert the major part of the first radiation. During this conversion, the first radiation is absorbed in the barrier layers of the wells 21R (or in the cladding 22R, 23R), and the electron-hole pairs thus created next recombine radiatively in the well or wells, thus emitting the second radiation.

The conversion layer 20R is delimited in the upper part by an upper face 25R (it is here the upper face of the upper layer 23R).

This upper face 25R is textured: a diffraction grating 30R, which forms a mono- or two-dimensional photonic crystal, is etched on this face. This grating is configured to improve the efficiency with which the second radiation is extracted from the conversion layer 20R, with respect to a completely planar interface, without relief.

Figure 2:
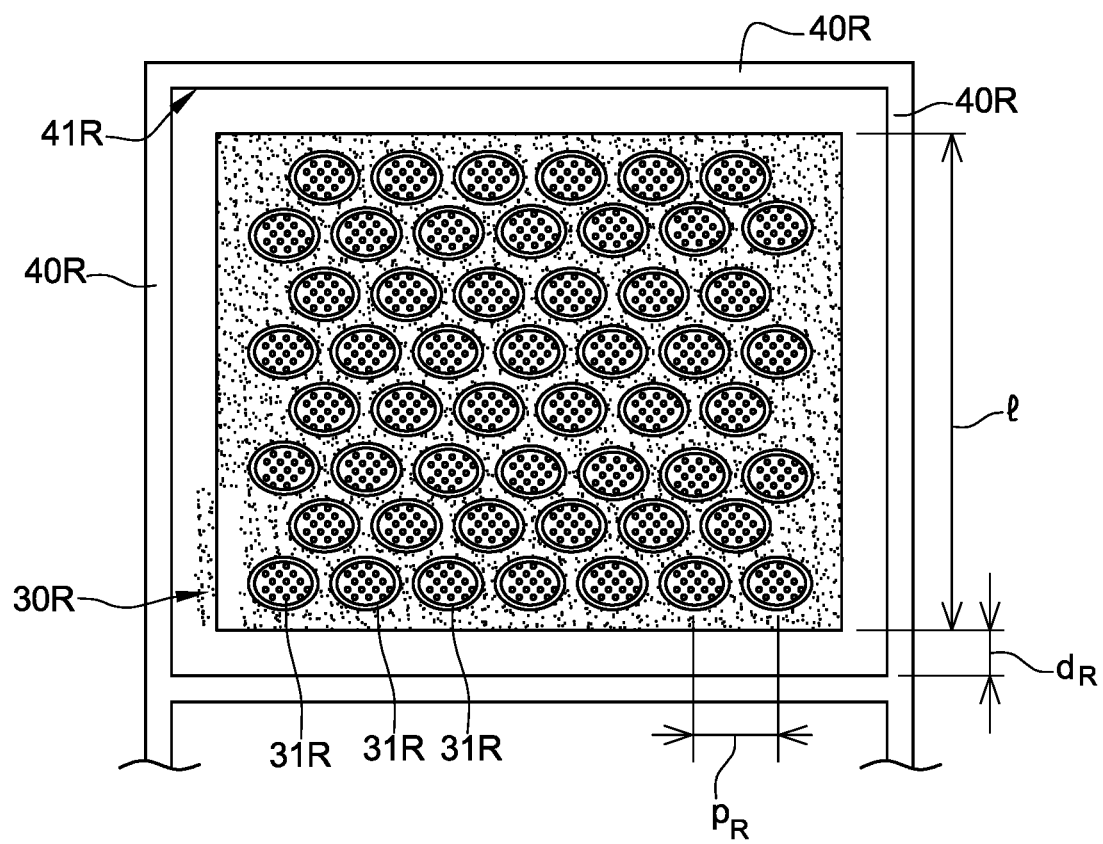
FIG. 2 schematically represents one of the emission devices of the pixel of FIG. 1, in top view.
Figure 3:
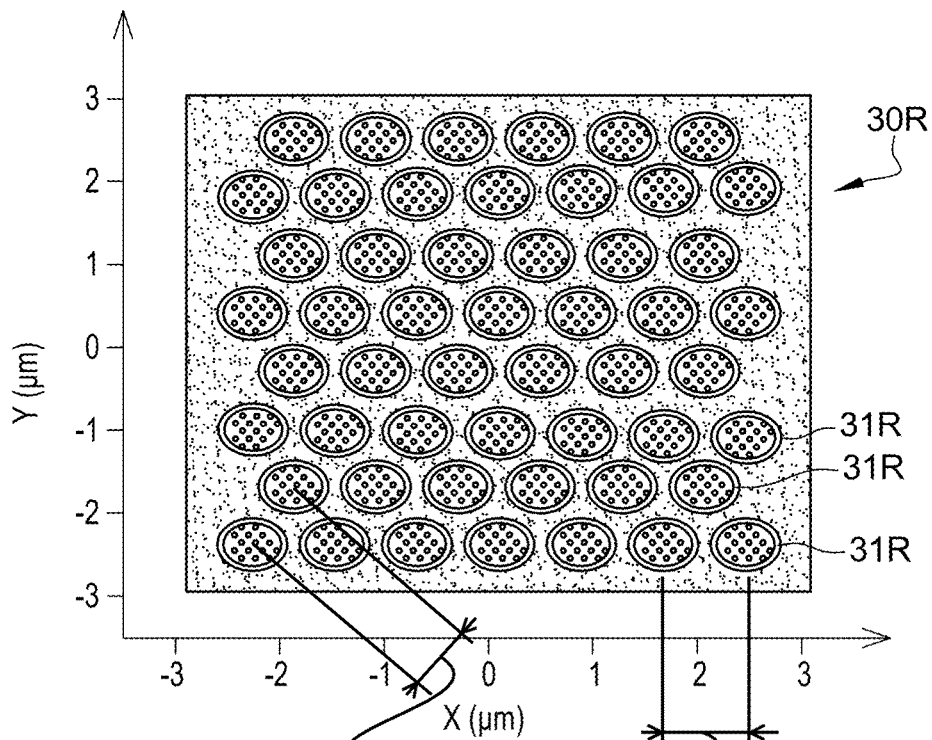
FIG. 3 schematically represents a diffraction grating of the emission device of FIG. 2.

The diffraction grating 30R is visible in FIG. 3, as well as in FIG. 2 which schematically represents the second device 1R, in top view.

In this example, the diffraction grating 30R, or, in other words, the extraction grating, is a two-dimensional grating. It thus comprises a same pattern 31R repeated periodically in two different directions of the plane of the grating (plane which is the plane of the upper face 25R). In this particular instance, it is a triangular grating (of which the elementary lattice is for example an equilateral triangle). But, in an alternative, it could be a grating having a different lattice, for example rectangular, or hexagonal. With regard to the pattern 31R, repeated periodically, it may just as well be holes or pillars. The diffraction grating in question could also be a one-dimensional grating, formed of grooves parallel with each other and regularly spaced apart (repeated periodically).

This grating makes it possible to improve the extraction efficiency of the second radiation, but it also makes it possible to give to the extracted light beam a determined shape and potentially polarisation. This makes it possible to adapt the radiation emitted by the device 1R to the application targeted for this device, with great flexibility.

Thus, for example, if a dominant polarisation along one axis is desired, a one-dimensional grating will desirably be employed. With such a grating, the light beam emitted will be composed mainly of two light sheets, slightly offset from one another by an angular point, and having transverse sections of elongated shape, parallel with each other, as may be seen in FIG. 5. This figure shows, in far field and in a plane parallel to the plane of the grating, the section 200 of the beam extracted by a mono-dimensional grating of several micron sides.

Figure 4:
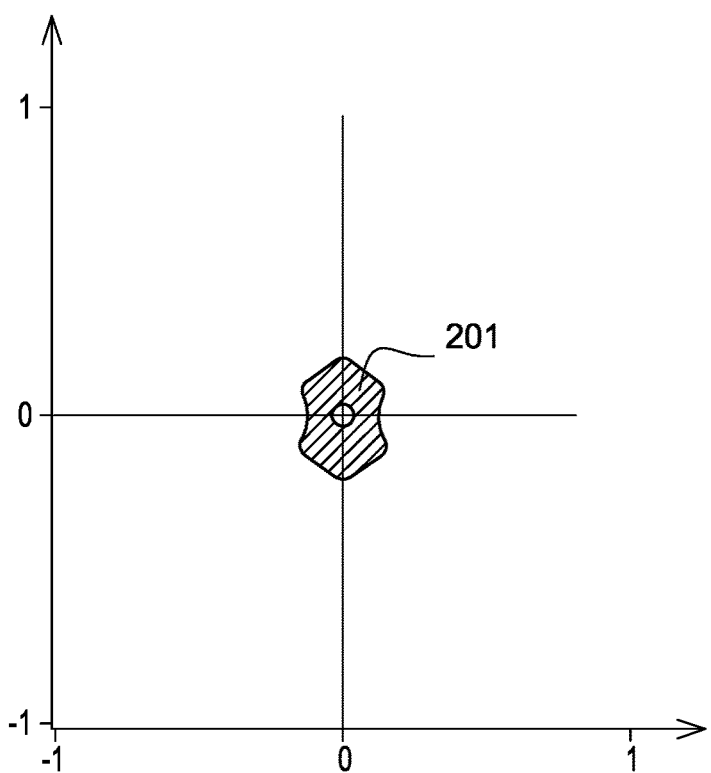
FIG. 4 schematically represents the section of a light beam produced by the emission device of FIG. 2.
Figure 5:
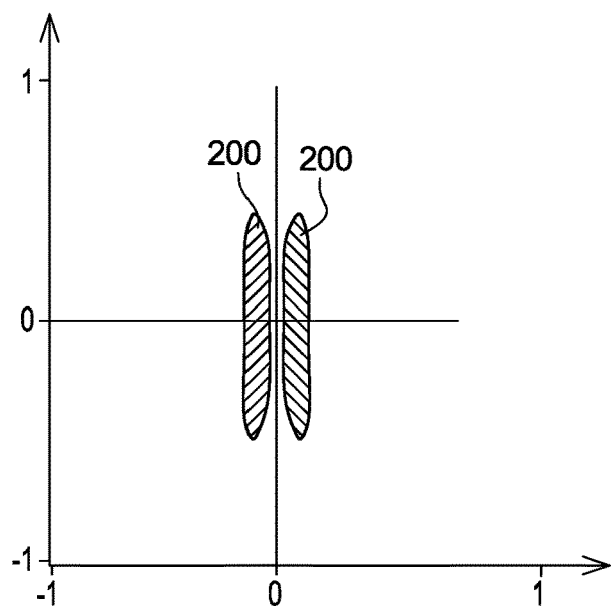
FIG. 5 schematically represents the section of a light beam produced by an emission device similar to the device of FIG. 2, but provided with another diffraction grating.

If it is wished on the other hand to obtain a beam having a section of globally isotropic shape, for example globally disc or ring shaped, a two-dimensional diffraction grating with hexagonal or triangular lattice could be employed (see FIG. 4). It is to be noted that the fine structure of the far field respects the symmetry of the photonic crystal. If the grating is of hexagonal lattice, a $6^{th}$ order symmetry will be found (repetition of patterns every 60°) in the fine structure of the field even if it globally has an isotropic shape (for a square lattice there will be $4^{th}$ order symmetry with two orthogonal axes of symmetry). FIG. 4 shows, in far field and in a plane parallel to the plane of the grating, the section 201 of the beam extracted by the triangular grating of FIG. 3.

Other types of two-dimensional gratings may obviously be envisaged, depending on the characteristics desired for the extracted light beam.

The dimensioning of the diffraction grating also depends on the thickness of the patterns, the index contrast of the grating, and the wavelength to extract, which here corresponds to the average wavelength of the second radiation noted $\lambda_R$.

Generally speaking, the grating period $p_R$ of the grating 30R is chosen between $\lambda_R/(2 \cdot n_1)$ and $2 \times \lambda_R$, where $n_1$ is the optical index of the high index material of the grating, material which corresponds to the material of the upper layer 23R of the conversion layer 20R (in this particular instance, here, aluminium indium gallium phosphide AlInGaP).

It is possible for example to provide that the grating period of the grating $p_R$ (or the grating period of the grating $p_R$, $p_{R'}$, in the case of a two-dimensional grating) is comprised between $\lambda_R/(2 \cdot n_1)$ and $\lambda_R/(n_1)$, or even between $\lambda_R/(2 \cdot n_1)$ and $(3 \cdot \lambda_R)/(4 \cdot n_1)$. Choosing a relatively small grating period $p_R$ in this way, close to the lower bound $\lambda_R/(2 \cdot n_1)$ of the range of grating periods that may be envisaged, makes it possible, for a given size of grating, to repeat the diffracting pattern a greater number of times, on the surface of the grating. This thus improves the extraction efficiency of the grating. This improvement is particularly notable here because the grating comprises a number of pattern repetitions which remains relatively small (this number being for example comprised between 5 and 50, for a one-dimensional grating). $\lambda_R$ is here the average wavelength of the second radiation.

It will be noted that the low index material of the grating here corresponds to the filling material 50, of which the index is noted $n_2$.

As may be seen in FIG. 1, the respective conversion layers of the second and third devices, 20R and 20G, have similar structures.

The conversion layer 20G of the third device 1G also comprises for its part at least one planar quantum well 21G. In this particular instance, this layer here comprises several quantum wells 21G, typically at least 2, or even at least 5 wells. It is indeed desirable to employ at least two, or even at least 5 wells, for this conversion layer, because the conversion of blue to green is in general less efficient than the conversion of blue to red. For certain very specific configurations of materials, in the case of the conversion of blue to green with the material GaN for example, it is even desirable, as here, to stack ten or so, or even several tens of InGaN quantum wells in such a way as to absorb the quasi-totality of the incident blue beam.

Each of these wells 21G is configured to emit the third radiation (radiation corresponding here to a green, and of which the spectrum is situated mainly in the range of wavelengths extending from 490 to 590 nm). The semiconductor materials employed to produce these quantum wells 21G may for example be indium gallium nitride InGaN for the central layer of the well, and gallium nitride GaN for the barrier layers.

The set of quantum wells 21G of this layer is enclosed between a lower layer 22G and an upper layer 23G, made of semiconductor materials. The upper layer 23G is for example made of gallium nitride GaN. As regards the lower layer 22G, it here comprises:
  a first sub-layer 22G', optional, made of aluminium gallium nitride AlGaN or gallium nitride GaN, which extends just under the quantum wells 21G, against the quantum well situated the lowest, and which forms a so-called EBL (electron blocking layer) sub-layer, and
  under the first sub-layer, a second sub-layer 22G", made of gallium nitride GaN, or aluminium gallium nitride AlGaN.

The lower layer 22G and the upper layer 23G each have for example a thickness comprised between 0.1 and 0.8 microns.

As for the second device, the conversion layer 20G of the third device 1G is delimited in the upper part by an upper face 25G (here it is the upper face of the upper layer 23G).

This upper face 25G is textured: a diffraction grating 30G, which forms a one-dimensional or two-dimensional photonic crystal, is etched on this face. This grating is configured to improve the efficiency with which the third radiation is extracted from the conversion layer 20G, with respect to an entirely planar interface, without reliefs.

The diffraction grating 30G is comparable with the diffraction grating 20G of the second device, except that it is configured to favour the extraction of a wavelength $\lambda_G$, equal to the average wavelength of the third radiation, instead of being configured to favour the extraction of the average wavelength $\lambda_R$ of the second radiation.

In particular, the grating period pc of the grating 30G is comprised between $\lambda_G/(2 \cdot n'_1)$ and $2 \times \lambda_G$, instead of being comprised between $\lambda_R/(2 \cdot n_1)$ and $2 \times \lambda R$. $n'_1$ is the optical index of the high index material of the grating 30G, material which corresponds to the material of the upper layer 23G (in this particular instance, here, gallium nitride GaN).

In addition to their conversion layer 20R, 20G, the second and the third emission devices 1R and 1G each comprise a lateral reflector 40R, 40G, having a reflective surface 41R, 41G which extends transversally with respect to the conversion layer 20R, 20G, facing a part at least of the lateral surface 24R, 24G of the considered conversion layer 20R, 20G.

As explained in detail in the section entitled "summary of the invention", this lateral reflector makes it possible, from an optical viewpoint, to increase the effective surface of the diffraction grating 30R, 30G, thus particularly improving the extraction efficiency of the grating.

In the example described here, the lateral reflector 40R, 40G of each of the devices 1R and 1G extends not only opposite a part of the lateral surface 24R, 24G of its conversion layer, but all around this lateral surface 24R, 24G. In other words, the lateral reflector 40R, 40G extends around the considered conversion layer 20R, 20G, over the whole perimeter of this layer.

Each conversion layer 20R, 20G has a rectangular or optionally square section, here, in a plane parallel to the median plane of the pixel 100.

In this case, the lateral surface 24R, 24G of the conversion layer 20R, 20G is thus formed of 4 faces, parallel two by two. And the perimeter of the conversion layer 20R, 20G, that is to say the line which surrounds this layer laterally (in other words, which laterally edges the conversion layer), is thus rectangular. The reflective surface 41R, 41G of the lateral reflector 40R, 40G, which extends all along this perimeter, also comprises four faces, in this particular instance planar faces, which surround the conversion layer. The reflective surface 41R, 41G also has for a rectangular section.

The different faces of the reflective surface 41R, 41G extend, respectively, opposite the different lateral faces of the conversion layer 20R, 20G, substantially parallel thereto (that is to say forming with them an angle less than 15, or even 5 degrees).

The fact that the reflective surface 41R, 41G surrounds the conversion layer 20R, 20G over the whole perimeter of this layer is favourable in terms of extraction efficiency. This enables to confine laterally the second, or the third radiation. Thanks to this confinement, the part of the second, or the third radiation which propagates in the conversion layer 20R, 20G, parallel to its upper face 25R, 25G, is maintained in the conversion layer where it makes back and forth journeys, which increases the length over which it interacts with the diffraction grating 30R, 30G, and which thus increases the extraction efficiency.

In an alternative, instead of surrounding the conversion layer over the whole perimeter of this layer, the reflective surface could however surround this layer on only a part of the perimeter of this layer. Nevertheless, in this case, the reflective surface desirably surrounds the conversion layer over the major part of the perimeter of this layer, in order, as explained above, to obtain good lateral confinement of the second, or third radiation.

Two of the lateral faces of the reflective surface 41R of the second device 1R are marked in FIG. 1, by the references 46R and 47R. These two faces are situated, respectively, opposite the lateral faces 26R and 27R of the conversion layer 20R.

As may be seen in FIG. 1, the two lateral faces 46R and 47R of the reflective surface 41R, which are situated opposite one another with respect to the conversion layer 20R, are substantially parallel with each other, that is to say that they form between them an angle less than 15 degrees, or even less than 5 degrees. This arrangement enables, in a simple manner, by successive reflections on the reflective faces 46R and 47R, the part of the second radiation which propagates in this layer 20R, parallel to its upper face 25R, to make a large number of back and forth journeys, in the conversion layer 20R. This arrangement thus makes it possible to obtain an effective grating length far larger than its "actual" geometric length l. As a comparison, for a reflective surface which would comprise a single reflective planar face, the effective length obtained would be around two times the geometric length l of the grating 30R. Whereas with these two faces 46R, 47R substantially parallel with each other, an effective length is obtained that is 10 times, or even 20 times greater than the geometric length l of the grating 30R (depending on the value of the reflection coefficient of the reflective surface).

The two other faces of the reflective surface 41R, not referenced, also form a pair of reflective faces, planar, substantially parallel with each other, thanks to which the effective width of the grating is de-multiplied (length is here taken to designate the dimension of the grating 30R, perpendicular to the plane of FIG. 1).

Two of the lateral faces of the reflective surface 41G of the third device 1G, situated on either side of the conversion layer 20G, are marked in FIG. 1 by the references 46G and 47G. These two faces are situated, respectively, opposite the lateral faces 26G and 27G of the conversion layer 20G. As for the second device, the two lateral faces 46G and 47G, planar, are substantially parallel with each other. And the same is true for the two other lateral faces of the reflective surface 41G, not referenced.

For each of the emission devices 1R and 1G, the lateral reflector 40R, 40G here has a rectangular section to adapt to the shape of the LEDs 10R, 10G and to the shape of the conversion layers 20R, 20G, themselves of rectangular section (occupying a rectangular surface, in a plane parallel to the substrate 81).

In an alternative, these different elements could however have a shape different from a rectangle, a square or a hexagon. For example, the LEDs, the conversion layers and the lateral reflector could have a triangular, or circular section.

Whatever the case, whether the lateral reflectors have a rectangular, hexagonal section, or other shape, the diffraction grating desirably has symmetries which are the same as those of the reflector. For example, for the emission device 1R represented in FIGS. 1 to 3, the lateral reflector, of rectangular section, is invariant by symmetry with respect to the plane of FIG. 1, and symmetry with respect to a second plane which is vertical and perpendicular to the plane of FIG. 1. And the same is true of the grating 30R (see FIG. 3). It will be noted that the grating 30R, triangular, could also be employed with a lateral reflector of hexagonal or triangular section, the reflector and the grating then both have the same symmetries. These two latter cases beneficially make it possible for all of the grating to obtain the same number of diffractive elements along the high symmetry directions of the grating (every 60° for the triangular lattice), since a grating or photonic crystal of triangular or hexagonal lattice fits perfectly on a hexagonal upper face.

The fact that the grating and the lateral reflector both have the same symmetries is interesting, because the reflection or reflections on the reflective surface of the reflector then have the effect, from an optical viewpoint, of identically de-multiplying the diffraction grating (put another way, adding the image of the grating to the grating itself then comes down to obtaining an effective grating of same structure, but more extended).

Here, each of the lateral reflectors 40R and 40G extends not only opposite the lateral surface 24R, 24G of the corresponding conversion layer but, vertically, downwards, to the upper layer 18 of the LED 10R, 10G which produces the first radiation ("blue" radiation here). The lateral reflector 40R and 40G thus extends axially from the upper layer 18 of the LED 10R, 10G, to the conversion layer 20R, 20G, and even over the whole height of the conversion stack 90, here (up to an upper face 101 of the pixel, which constitutes for example a free upper face).

The first emission device 1B, which is deprived of any conversion layer, is also provided with a lateral reflector 40B. This reflector 40B extends axially, from the upper layer 18 of the LED 10B of this device, to the same height as the conversion layers 20R, 20G, and even to the upper face 101 of the pixel 100. The zone of the space surrounded by this reflector 40B extends above the LED 10B, in line therewith, and coincides with the surface of the upper face 18 of the LED 10B. This zone is filled by the filling material 50.

The different lateral reflectors 40R, 40G and 40B are produced here:

by forming substantially vertical trenches in the conversion stack 90, more precisely in the filling material 50 which serves as support and protection for the conversion layers 20R, 20G, and by filling these trenches with a metal, for example gold Au, silver Ag, titanium Ti, aluminium Al or any other metal capable of reflecting visible light.

The trenches thus formed in the conversion stack 90 extend in line with the lateral metal walls 16, described above, which separate the different LEDs 10R, 10G, 10B from one other.

Given the mode of manufacture of the lateral reflectors 40R, 40G and 40B, certain parts of these reflectors are common to several different reflectors. The reflectors 40R and 40G comprise for example a metal wall which is common to these two reflectors, at the boundary between the second and the third emission devices 1R and 1G (FIG. 1).

The metal walls which form the lateral reflectors 40R, 40G and 40B desirably have a thickness greater than or equal to 0.1 microns, in order to be the most reflective possible and to avoid a passage of light between two adjacent emission devices.

The lateral reflector 40R forms, with the lateral metal walls 16 which surround the active layer 15 of the LED 10R, a lateral confinement system for the first radiation emitted by this LED 10R. This confinement system, which here also comprises the contact pick-up elements 17, extends axially from the active layer 15 of the LED 10R to the conversion layer 20R (and even beyond, given the vertical extension of the lateral reflector 40R).

This lateral confinement system guides the first radiation emitted by the LED 10R, from the active layer 15 to the conversion layer 20R where it is converted, thus avoiding this radiation reaching the conversion layer 20G of the third device 1G (which would produce a little parasitic green light, instead of producing red light), or does not come out of the pixel 100 without traversing the conversion layer 20R. This lateral confinement of the first radiation thus enables to improve the purity of the colours produced, and limits crosstalk between the different elementary emitting devices 1R, 1G, 1B of the pixel 100. Achieving this lateral confinement by means of a reflective metal material makes it possible, at the outlet of the pixel, to deliver a luminous power greater than that which would be obtained with absorbent, non-reflective lateral walls, for example made of absorbent black resin.

In the same way, the lateral reflector 40G of the third device 1G forms, with the lateral metal walls 16 which surround the active layer 15 of the corresponding LED 10G, a lateral confinement system for the first radiation, and the same is true for the lateral reflector 40B of the first device 1B.

As may be seen in FIG. 1, for the second and third devices 1R, 1G, the reflective surface 41R, 41G of the lateral reflector 40R, 40G is separated from the lateral surface 24R, 24G of the corresponding conversion layer by a non-zero distance $d_R$, $d_G$. The space situated between these two surfaces is filled by the filling material 50 (of index $n_2$).

Here, the distance $d_R$ is greater than $\lambda_R/(n_2 \times 40)$, whereas the distance $d_G$ is greater than $\lambda_G/(n_2 \times 40)$. Separating the conversion layer 20R, 20G from the reflective surface 41R, 41G, which is here metallic, enables to avoid plasmonic coupling with the metal of the reflector, coupling which would cause power losses (point which has been confirmed by digital simulations, of finite differences in the temporal domain type).

Here, the distance $d_R$ is moreover less than $\lambda_R/(n_2 \times 2)$, whereas the distance $d_G$ is less than $\lambda_G/(n_2 \times 2)$. From an optical viewpoint, this enables to avoid a too large discontinuity (that is to say an important difference with respect to the grating period $p_R$, $p_G$ of the grating), between the grating 30R, 30G itself and its image by the reflective surface. In other words, this enables to obtain an effective optical grating close to a grating with a regular, constant grating period $p_R$, $p_G$, without discontinuity between the actual grating and its replication or replications by the reflective surface 41R, 41G. This is interesting, because the extraction efficiency of an extended and almost perfectly periodic "effective" grating is better than that of an extended effective grating with discontinuities between each replication of the initial grating. To optimise the regularity with which the grating is replicated, from an optical viewpoint, the distance $d_R$ and the distance $d_G$ may moreover be chosen in narrower ranges of distances than the range $\lambda_R/(n_2 \times 40)$ to $\lambda_R/(n_2 \times 2)$, and $\lambda_G/(n_2 \times 40)$ to $\lambda_G/(n_2 \times 2)$. The ranges in question, determined for example by digital simulation, may for example be chosen in such a way that, for the patterns situated on the edges of the grating 30R, 30G, the effective distance between the pattern 31R considered and its image by the reflective surface 41R, 41G does not differ from the grating period $p_R$, $p_G$ of the grating by more than 20%. The adjustment (during digital simulations) of the distances $d_R$ and $d_G$ thus enables, by adjusting the phase shift due to the reflection, to maximise the power of the extracted radiation (while tending towards virtually perfect effective replication of the grating).

Figure 6:
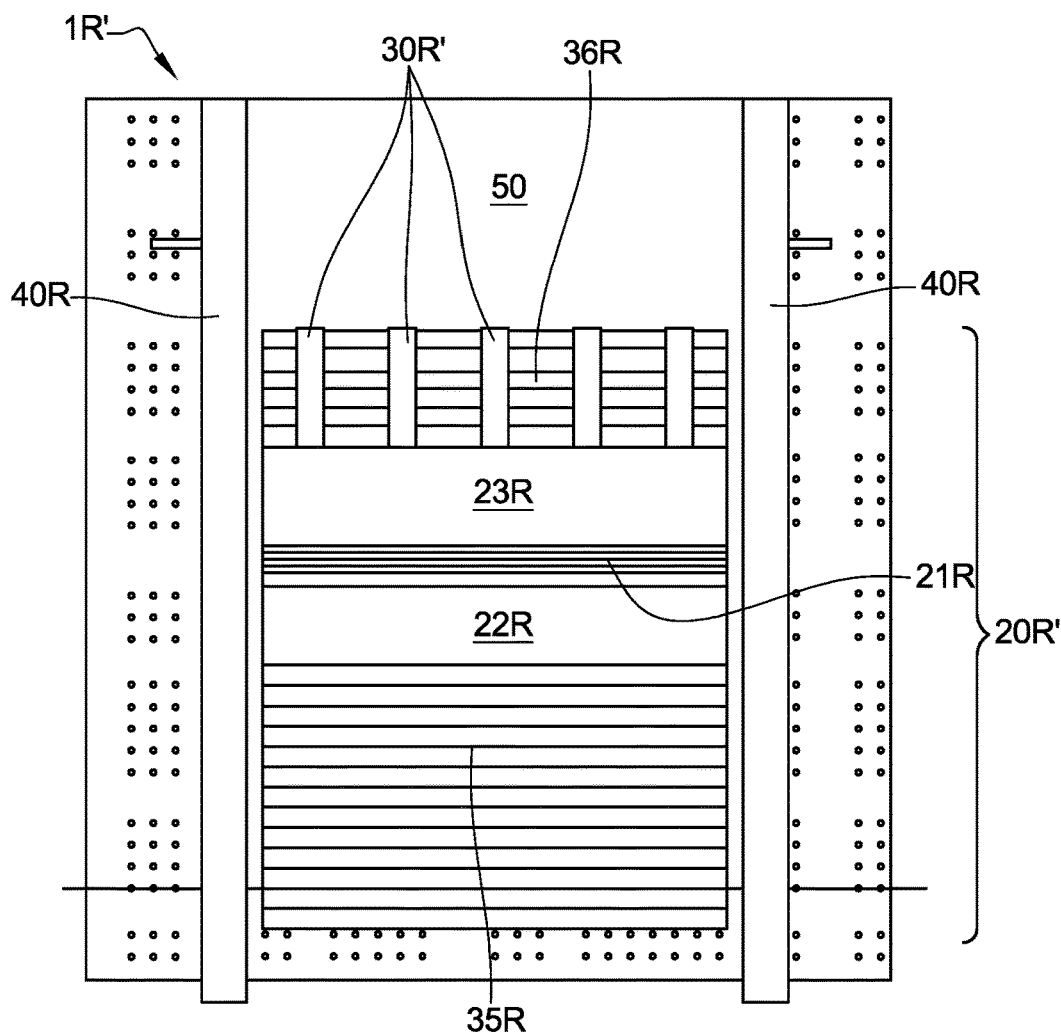
FIG. 6 schematically represents a section of another embodiment of the emission device of FIG. 2, in side view.

FIG. 6 schematically and partially represents another embodiment of the second emission device, 1R'.

The second device 1R' according to this second embodiment is identical to the second device 1R according to the first embodiment, which has been described above with reference to FIGS. 1 to 4, except that it further comprises a first and a second multilayer reflective filter 35R and 36R, situated respectively below and above the stack comprising the layers 22R, 21R and 23R.

The first filter 35R is situated between the LED 10R and the quantum well or wells 21R. It is at least partially reflective for the second radiation (red). Its reflectivity, that is to say its coefficient of reflection of the luminous power, is for example greater than 70%, or even greater than 90%, for the second radiation. The first filter 35R may furthermore be configured to have a high coefficient of transmission, for example greater than 70%, or even greater than 90%, at the average wavelength of the first radiation (blue), coming from the LED 10R. This allows an important part of the first radiation to reach the quantum well or wells 21R, where this first radiation is converted.

The second filter 36R extends directly above the upper layer 23R of the conversion layer 20R', against this upper layer. It is at least partially reflective for the first radiation. Its reflectivity is for example greater than 70%, or even greater than 90%, for the first radiation. This avoids a part of the first radiation, which would not have been absorbed by the conversion layer, coming out of the device 1R', thus improving the purity of the colour of the radiation finally emitted by the device 1R'. Further, the part of the first radiation which would not have been absorbed and converted is then sent back to the quantum well structure 21R where this residual part of the first radiation may be absorbed and converted.

The second filter 36R may moreover be configured to have a high coefficient of transmission, for example greater than 70%, or even greater than 90%, for the second radiation, emitted by the quantum well or wells 21R, thus facilitating the extraction of this radiation.

In an alternative, the second filter 36R could however be configured in such a way as to have a moderate coefficient of transmission for the second radiation, for example less than 60%, and a coefficient of reflection, for this same radiation, comprised for example between 40 and 70%. In this case, the set of first and second filters 35R and 36R then forms a Fabry-Pérot cavity. The optical thickness of the conversion layer 20R' is then chosen in such a way that this cavity is resonant for the average wavelength $\lambda_R$ of the second radiation, while having a transmission peak for this wavelength. This arrangement enables, among other things, to fine tune the spectrum of the light produced, by photoluminescence, by this conversion layer 20R'. The adjustment of the tuning and the quality factor of this Fabry-Pérot cavity make it possible to define precisely the spectral redistribution and the width at half maximum of the extracted radiation.

In a manner known from the prior art, the adjustment of a cavity is defined by the phase shift $d\phi$ between two successive exiting rays:

$$d\phi(\theta) = 2knl(\cos\theta)$$

where n is the refractive index of the cavity; l is the effective thickness of the cavity; $\theta$ is the angle of refraction of the rays and $k = 2\pi/\lambda_R$ with $\lambda_R$ the wavelength of the radiation. The successive rays interfere constructively if their phase shift $d\phi$ is equal to $2\pi$ (modulo $2\pi$); and they interfere destructively if their phase shift $d\phi$ is equal to $\pi$ (modulo $2\pi$).

Each of the first and second filters 35R, 36R is for example a Bragg mirror, produced by a combination of thin dielectric layers of thickness $\lambda/4n$ and of high and low indices (where n is the optical index of the considered thin layer), for example of $SiO_2/TiO_2$ or $SiO_2/Si_3N_4$. The optical indices of these materials are, at 460 nm, respectively 1.464/2.7878 and 1.464/2.0751. The thickness of each of these Bragg mirrors is typically of the order of a micron, or even less than 1 micron. Alternatively, each of the first and second multilayer reflective filters 35R, 36R is for example a non-periodic stack of layers of optimised thicknesses, making it possible to obtain a precise filter transmission curve.

It is possible to produce the Fabry-Pérot cavity in question directly by epitaxy, or by deposition of successive thin layers (after epitaxy of the grating), which is generally simpler in terms of manufacture.

For this embodiment of the second device 1R', the diffraction grating 30R', which favours the extraction of the second radiation, may take the form of holes or pillars which traverse the thin layers of the second filter 36R, as represented in FIG. 6. Other ways of producing this diffraction grating, with for example a less deep etching, on the surface of the second filter, may also be considered.

In an alternative that is not represented, the third emission device could also be provided with first and second multilayer reflective filters, arranged in a manner similar to the first and second filters 35R, 36R of the second device 1R' which have been described above.

In the case of the third emission device, the first filter, which would then be interposed between the LED 10G and the quantum wells 21G, would be configured more precisely to reflect a part at least of the third radiation, with a reflectivity of more than 70%, or even more than 90% for the third radiation, for example.

Concerning the second filter, which would extend above the quantum wells 21G, it would then be configured to have a high coefficient of transmission, for example greater than 70%, or even greater than 90%, at the average wavelength $\lambda_G$ of the third radiation, emitted by the quantum well or wells 21G, thus facilitating the extraction of this radiation. This second filter could moreover be configured, here also, in such a way as to have a high reflectivity (more than 70%, or even more than 90%) for the first radiation.

The second filter could however also be configured in such a way as to have a moderate coefficient of transmission for the third radiation, for example less than 60%, and a coefficient of reflection, for this same radiation, comprised for example between 40 and 70%. In this case, the set of the first and second filters would then form a Fabry-Pérot cavity, having an optical thickness such that this cavity is resonant for the average wavelength $\lambda_G$ of the third radiation, while having a transmission peak for this wavelength.

Providing the conversion layer of the third device with these first and second multilayer filters (whether they form a Fabry-Pérot cavity or not) is particularly interesting, because the conversion of blue to green, by means of the quantum wells 21G made of indium gallium nitride InGaN, is less efficient than the conversion of blue to red. Recycling the first radiation, blue, not converted during a first crossing of the conversion layer, by means of the second filter, is thus even more interesting for the third device than for the second device (since this recycling increases the conversion efficiency).

As may be seen in FIG. 1, the respective conversion layers 20R, 20G of the second and third devices 1R and 1G are offset with respect to each other. In a direction perpendicular to the plane of the substrate 81, they thus occupy different positions. This vertical offset between the conversion layers 20R, 20G results from the method for manufacturing the pixel 100.

Figure 10:
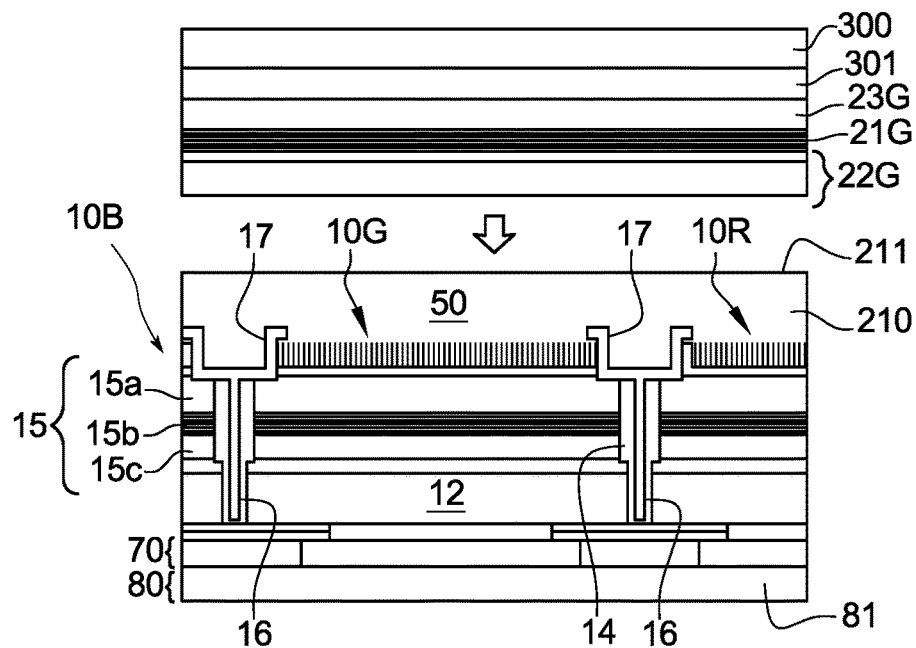
FIG. 10 schematically and partially represents the pixel of FIG. 1, at another intermediate stage of its manufacture, in section and side view.

Indeed, in the course of this method, the conversion layer 20G is firstly produced on a substrate 300, different from the substrate 81 on which the electrically pumped LEDs 10R, 10G, 10B are produced. The conversion layer 20G is next transferred onto the structure of LEDs 10R, 10G, 10B (FIG. 10). Next, in the same way, the conversion layer 20R, initially produced on another substrate 400, is transferred onto the pixel 100 (FIG. 13), which explains the structure in successive layers, similar to stairs, of the conversion stack 90.

The method for manufacturing the pixel 100 will now be described in greater detail.

Figure 7:
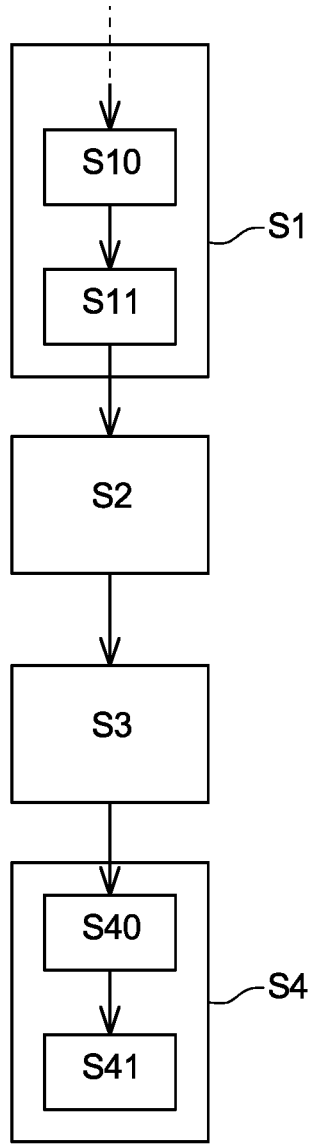
FIG. 7 schematically represents steps of a method for manufacturing the device of FIG. 1.

As may be seen in FIG. 7, this method comprises the following main steps:

Step S1: producing the structure of electrically pumped, LEDs 10R, 10G, 10B then Step S2: producing the conversion layer 20G of the third device 1G, then Step S3: producing the conversion layer 20R of the second device 1R, then Step S4: producing the lateral reflectors 40R, 40G, 40B.

Step S1 firstly comprises a step S10 of producing a structure of LEDs 10R, 10G, 10B such as described previously, which here comprises the active layer 15, arranged on the interconnection stack 70, itself arranged on the integrated control circuit 80. This circuit is produced on and/or in the substrate 81, typically made of silicon, called first substrate hereafter. Optionally, step S10 comprises the production of the textured layer 18 such as described previously.

Figure 9:
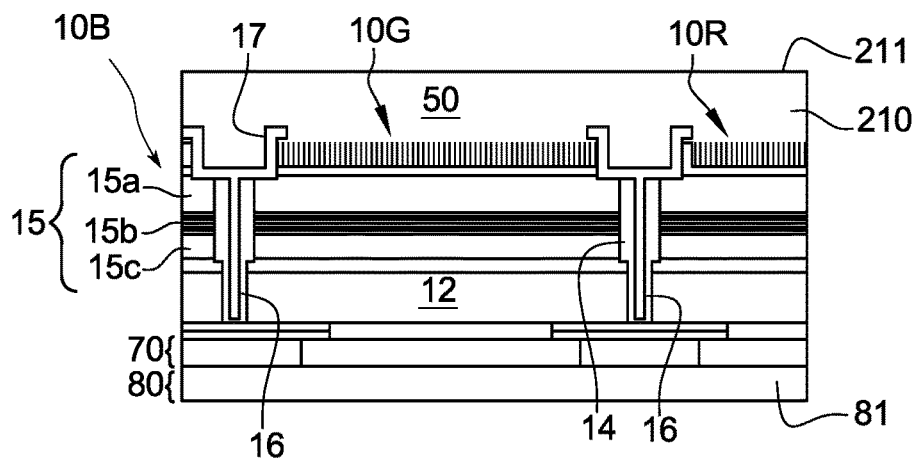
FIG. 9 schematically and partially represents the pixel of FIG. 1, at an intermediate stage of its manufacture, in section and side view.

The method next comprises a step S11 of encapsulation and planarization. This step comprises the deposition, typically by conformal deposition, of an insulator layer 210, formed of the filling material 50 (typically $SiO_2$), either on the textured layer 18, or directly on top of the active layer 15. The method next comprises a step of planarization, typically by CMP (chemical mechanical polishing), of the insulator layer 210. This latter step makes it possible to obtain a first contact surface 211, particularly smooth and flat, well suited to achieving molecular adhesion between this contact surface and another structure. The FIG. 9 shows the result obtained at the end of planarization of the insulator layer 210.

Figure 8:
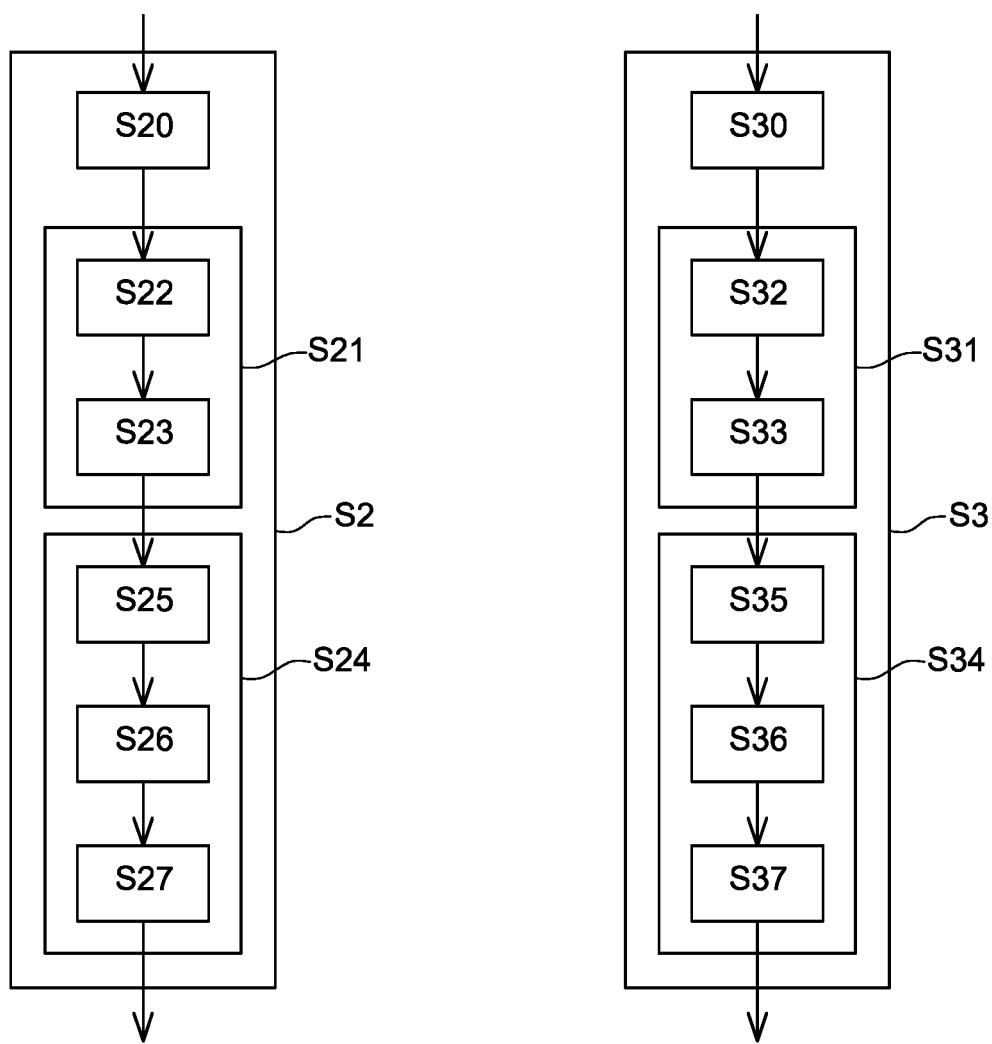
FIG. 8 schematically represents in greater detail some steps of the method of FIG. 7.

As may be seen in FIG. 8, step S2 of producing the conversion layer 20G comprises the following steps:
S20: producing, on a second substrate 300, a stack which also comprises cladding layers 22G and 23G as well as a stack of planar quantum wells 21G enclosed (as it were sandwiched) between these two cladding layers (see FIG. 10),
S21: transfer of this stack onto the structure of LEDs 10R, 10G, 10B and removal of the second substrate 300 (FIG. 11),
S24: shaping and encapsulation of the conversion layer 20G.

The second substrate 300 on which the stack is produced, which, after etching, will form the conversion layer 20G, is for example a silicon or sapphire substrate. A buffer layer 301 may be deposited on this substrate, before producing the stack in question.

Step S21 comprises a step of transfer S22, then a step of removal of the substrate S23.

During the transfer step S22, the free face of the layer 22G is placed in contact with the first contact surface 211. The stack 22G, 21G, 23G is then fixed onto this surface directly by molecular adhesion, that is to say without using additional bonding material. In an alternative, the stack 22G, 21G, 23G could however be fixed onto the first contact surface 211 by bonding.

During step S23, the removal of the second substrate 300 is for example a laser lift off, when the second substrate is made of sapphire. When the second substrate is made of silicon, it may for example be removed by thinning.

Figure 11:
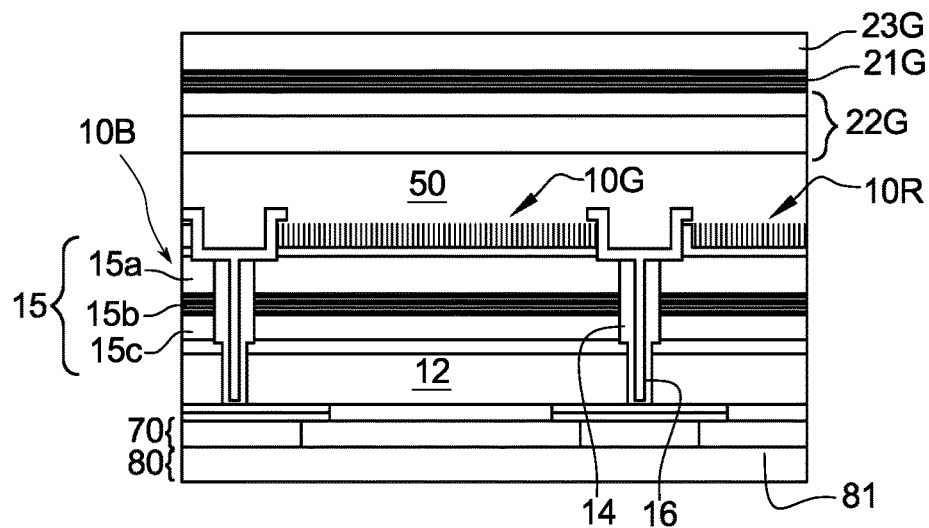
FIG. 11 schematically and partially represents the pixel of FIG. 1, at another later stage of its manufacture, in section and side view.

FIG. 11 shows the pixel 100, at an intermediate stage of its manufacture, just after the removal step S23.

The following step S24, of shaping and encapsulating the conversion layer 20G, comprises the following steps:
S25: producing the diffraction grating 30G,
S26: etching the stack of layers 22G, 21G, 23G, to delimit the conversion layer 20G laterally,
S27: encapsulation and planarization.

During step S25, the diffraction grating 30G is etched on the free upper face of the layer 23G. This etching typically comprises the deposition of a mask followed by a DUV (deep UV) type lithoetching. Alternatively, this etching may be a RIE (reactive ion etching).

Step S26 may for its part also comprise the deposition of a mask followed by a DUV type lithoetching, or be produced by reactive ion etching (RIE). At the end of this step, the conversion layer 20G forms an island, or mesa, laterally delimited by the aforementioned lateral surface 24G.

During step S27, filling material 50 is deposited around and on the island that forms the conversion layer 20G. The upper surface of this filling layer is next polished, typically by CMP (chemical mechanical polishing), to obtain a second contact surface 212, particularly smooth and flat.

Figure 12:
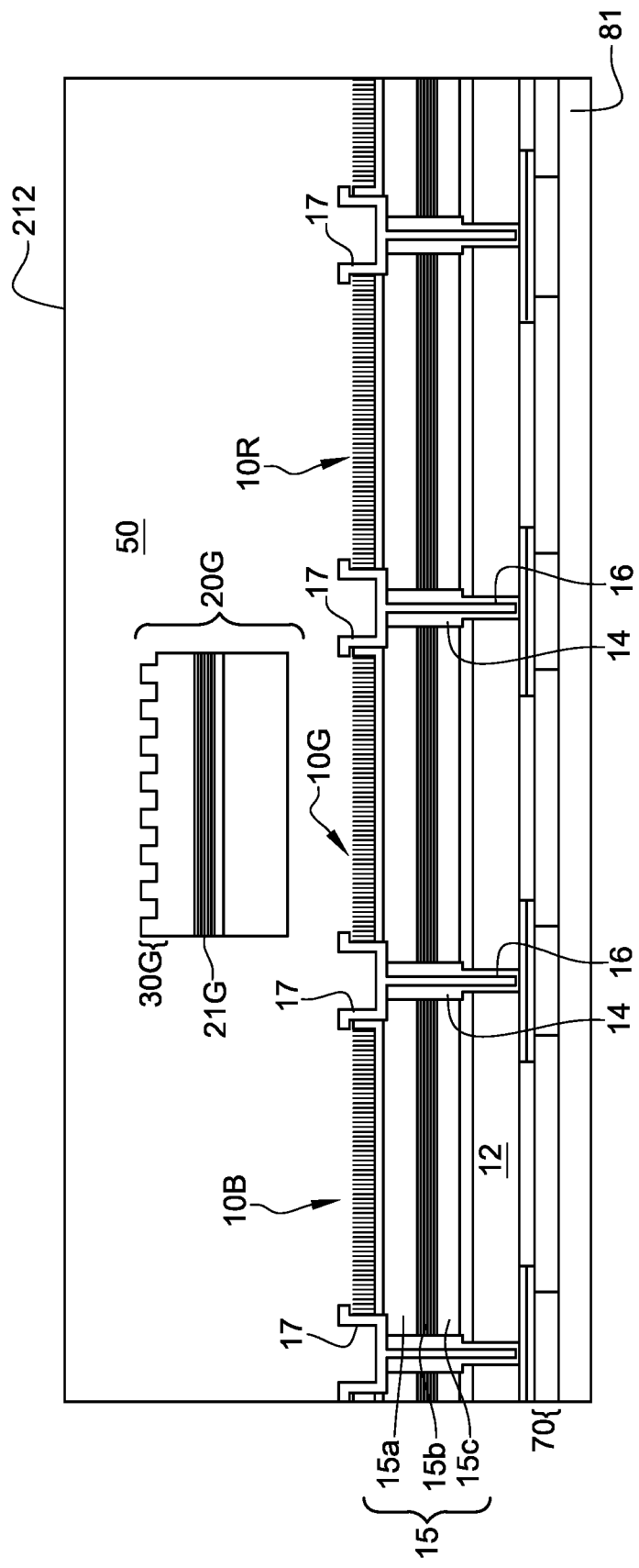
FIG. 12 schematically represents the pixel of FIG. 1, just after a step of producing a conversion layer, in section and side view.

FIG. 12 shows the pixel, during manufacture, once step S2 has been executed.

Step S3 of producing the conversion layer 20R comprises steps S30 to S37 similar, respectively, to steps S20 to S27 which have been described.

During step S30, the stack of layers 22R, 21R, 23R, which, after etching, will form the conversion layer 20R, is produced on a third substrate 400, here formed of gallium arsenide GaAs.

Figure 13:
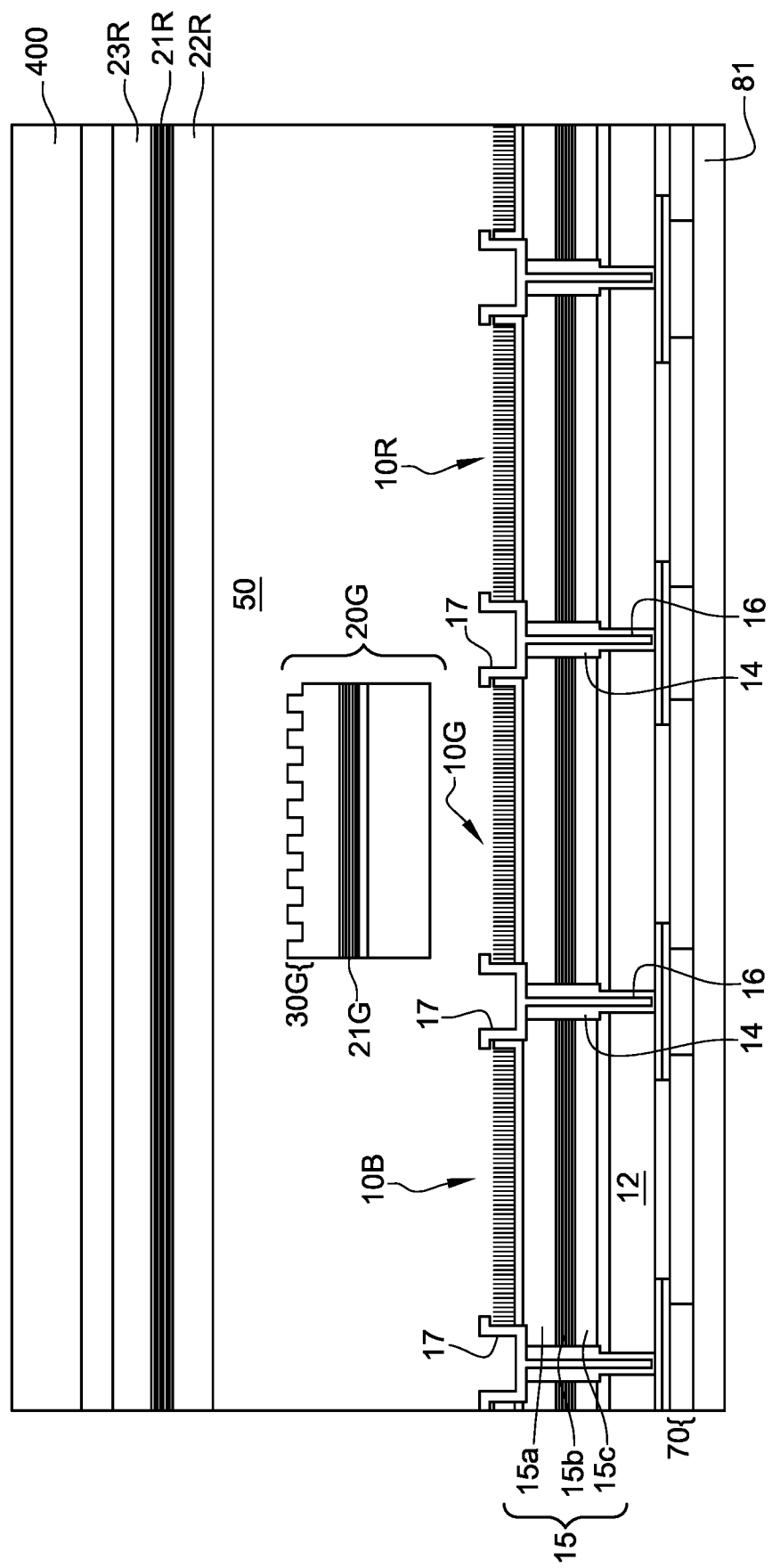
FIG. 13 schematically represents the pixel of FIG. 1, at an intermediate stage of its manufacture, after the transfer of a stack intended to produce another conversion layer.

The stack of layers 22R, 21R, 23R is transferred and fixed (for example by molecular adhesion) onto the second contact surface 212, during step S32. FIG. 13 shows the pixel, during manufacture, just after this transfer step.

During the following removal step, S33, the third substrate 400 may be removed by selective chemical attack, by sulphuric acid $H_2SO_4$, phosphoric acid $H_3PO_4$, or ammonia solution $NH_{3(aq)}$. Indeed, these substances attack gallium arsenide more strongly than aluminium indium phosphide AlInGaP or indium gallium phosphide InGaP.

Step S35 of producing the diffraction grating 30R may be carried out, like step S25, by deposition of a mask followed by a DUV type lithoetching, or by reactive ion etching (RIE).

Step S36 of lateral etching the layers 22R, 21R, 23R, and step S37 of encapsulation of the conversion layer 20R are identical, respectively, to steps S26 and S27 described above.

FIG. 14 shows the pixel 100, during manufacture, just after step S3.

Step S4 of producing lateral reflectors 40R, 40G, 40B comprises a step S40 of opening the trenches which, in the conversion stack 90, delimit the different emission devices 1R, 1G, 1B. These trenches may be produced by deep RIE (reactive ion etching). Each trench is here aligned with one of the contact pick-up elements 17.

The method next comprises a step S41 of depositing metal in the trenches, for example by ECD (electrochemical deposition), followed by a step of planarization, for example by CMP, in order to avoid any short-circuit. The method may next comprise a step of producing contacts Ch (contact pad common to the cathodes) and Cb (contact pad common to the anodes, in other alternatives), at the end of the cathode and anode lines, typically by means of the deposition of a metal followed by etching. FIG. 1 shows the result obtained at the end of step S4.

Filling the trenches with metal in this way is more difficult and more expensive than optically isolating the devices 1R, 1G, 1B from one another by means of black absorbent resin (in particular because the metal is virtually in liquid form to fill the trenches in question). This production requires in particular to have access both to manufacturing means specific to nanophotonics (to produce the quantum wells and the photonic crystals), and to manufacturing means specific to microelectronics on silicon, in particular to carry out the electrochemical deposition ECD.

In another embodiment, the method for manufacturing the pixel could also comprise steps of producing the first and second multilayer reflective filters 35R, 36R which, optionally, enclose the active part of the conversion layer 20R' of the second emission device 1R' and/or the third emission device.

In this case, the multilayer reflective filters 35R, 36R of the second device 1R' may be produced during the manufacture, on the third substrate 400, of the stack of layers 22R, 21R, 23R (thus during step S30, before step S31 of transfer and removal of the third substrate 400). In this case, the second filter 36R is produced by deposition on the third substrate 400, before the production of the stack of layers 22R, 21R, 23R, and the first filter 35R is produced by deposition on the layer 22R, once it has been produced. The set of filters 35R and 36R, and the stack of layers 22R, 21R, 23R sandwiched between these filters is next transferred altogether onto the second contact surface 212.

In the same way, when the third emission device is provided with the first and second reflective filters described above, these filters may be produced during the manufacture, on the second substrate 300, of the stack of layers 22G, 21G, 23G (thus during step S20, before step S21).

In an alternative, the first and second reflective filters 35R, 36R could however be produced, by deposition, directly above the LED 10R, rather than being produced on the third substrate 400, then transferred. In this case, the first filter 35R could be manufacture by carrying out depositions on the second contact surface 221, before the stack of layers 22R, 21R, 23R is transferred onto this filter 35R. And the second filter could then be produced, by deposition on the layer 23R, just after step S31 of transfer and removal, and before step S24 of shaping and encapsulating the conversion layer 20R'.

In the same way, the first and second reflective filters of the third device could be produced, by deposition, directly above the LED 10G, rather than being produced on the second substrate then transferred.

Different embodiments and alternatives of a method for manufacturing the pixel 100 have been described above. But it will easily be understood that the invention also relates to a method for manufacturing a light emitting device, such as the second device 1R, 1R' or the third device 1G, considered alone, as such. Such a device could be manufactured, as explained above, by transfer onto a first substrate of a stack comprising the conversion quantum wells, the stack being produced beforehand on another substrate.

The invention also relates to a method for manufacturing the aforementioned display, which comprises a matrix of colour pixels such as the pixel 100. This display may for example be produced by means of a method similar to the method of FIG. 7 but wherein:
- at step S10, several triplets of electrically pumped LEDs 10R, 10G, 10B are produced on the first substrate 81 (as many triplets as said matrix has pixels),
- at step S26, several islands (as many islands as pixels), each forming a conversion layer 20G for an emission device in the green, are etched, for example simultaneously, in the stack of layers 22G, 21G, 23G (initially very extended laterally) which had been transferred beforehand onto the first contact surface 211,
- similarly, at step S36, several islands (as many islands as pixels), each forming a conversion layer 20R for an emission device in the red, are etched, for example simultaneously, in the stack of layers 22R, 21R, 23R (initially very extended laterally) which had been transferred beforehand onto the second contact surface 212, and
- at step S4, trenches are produced which, in the conversion stack 90, laterally delimit each individual emission device 1R, 1G, 1B of the matrix of pixels, and these trenches are filled with metal.

It will be noted that different alternatives may be made to the methods which have been described, in addition to those already mentioned above. Thus, for example, it could be provided to carry out step S3 before step S2.

The invention claimed is:

1. An optoelectronic light emitting device comprising:
    a light emitting diode configured to emit a first radiation, and
    a conversion layer which extends above the light emitting diode and which is configured to convert a part at least of the first radiation into a second radiation, by photoluminescence, the conversion layer being delimited laterally by a lateral surface, the conversion layer comprising at least one planar quantum well configured to emit the second radiation,
    a diffraction grating, configured to extract a part at least of the second radiation from the conversion layer, the diffraction grating being etched on an upper face of the conversion layer, and
    a lateral reflector having a reflective surface which extends transversally with respect to the conversion layer, facing a part at least of the lateral surface of the conversion layer, the reflective surface of the reflector and the lateral surface of the conversion layer being separated from each other by a material having an optical index $n_2$, and wherein a distance separating the reflective surface of the reflector from the lateral surface of the conversion layer is comprised between $\lambda/(n_2 \times 40)$ and $\lambda/(n_2 \times 2)$ where $\lambda$ is the average wavelength of the second radiation.

2. The device according to claim 1, wherein the reflective surface of the reflector extends around the conversion layer, over a major part of a perimeter of the conversion layer.

3. The device according to claim 1, wherein the reflective surface of the reflector comprises at least a first reflective face and a second reflective face, each reflective face extending transversally with respect to the conversion layer, facing a part of the lateral surface of the conversion layer, the second reflective face being situated opposite the first reflective face with respect to the conversion layer, the first and second reflective faces being substantially parallel with each other.

4. The device according to claim 1, wherein the reflector is formed, at least superficially, of a metal.

5. The device according to claim 1, wherein the upper face of the conversion layer extends onto an area less than 1000 microns square.

6. The device according to claim 5, wherein the area is less than 100 microns square.

7. The device according to claim 1, wherein the light emitting diode comprises an active layer from where is emitted the first radiation, the device further comprising a lateral confinement system which includes said lateral reflector, which extends axially from the active layer to the conversion layer and which is configured to confine the first radiation laterally.

8. The device according to claim 1, comprising a first multilayer reflective filter which extends between the light emitting diode and the planar quantum well and which is at least partially reflective for the second radiation.

9. The device according to claim 1, comprising a second multilayer reflective filter which extends above the planar quantum well and which is at least partially reflective for the first radiation.

10. A pixel comprising:
    an optoelectronic device according to claim 1, and
    an additional optoelectronic light emitting device comprising:
        an additional light emitting diode configured to emit said first radiation, an additional conversion layer which extends above the additional light emitting diode and which is configured to convert a part at least of the first radiation into a third radiation, by photoluminescence, the additional conversion layer being delimited laterally by a lateral surface, the additional conversion layer comprising at least one additional planar quantum well configured to emit the third radiation, an additional diffraction grating, configured to extract a part at least of the third radiation from the additional conversion layer, the additional diffraction grating being etched on an upper face of the additional conversion layer, and an additional lateral reflector having a reflective surface of which a part at least extends transversally with respect to the additional conversion layer, facing the lateral surface of the additional conversion layer.

11. The pixel according to claim 10, further comprising another optoelectronic light emitting device which comprises another light emitting diode configured to emit said first radiation and which is:

either with no conversion layer, or provided with an additional conversion layer, configured to convert a part at least of the first radiation into a fourth radiation different from the second and third radiations.

12. A display comprising a matrix of pixels according to claim 10.

13. A method for manufacturing an optoelectronic light emitting device, comprising:

producing a light emitting diode configured to emit a first radiation, producing a conversion layer, which extends above the light emitting diode and which is configured to convert a part at least of the first radiation into a second radiation, by photoluminescence, the conversion layer being delimited laterally by a lateral surface producing the conversion layer comprising a step of producing a planar quantum well configured to emit the second radiation, the method further comprising:

etching a diffraction grating on an upper face of the conversion layer, the diffraction grating being configured to extract a part at least of the second radiation from the conversion layer, and producing a lateral reflector having a reflective surface which extends transversally with respect to the conversion layer, facing a part at least of the lateral surface of the conversion layer, the reflective surface of the reflector and the lateral surface of the conversion layer being separated from each other by a material having an optical index $n_2$, and wherein a distance separating the reflective surface of the reflector from the lateral surface of the conversion layer is comprised between $\lambda/(n_2 \times 40)$ and $\lambda/(n_2 \times 2)$ where $\lambda$ is the average wavelength of the second radiation.

14. The method according to claim 13, wherein the light emitting diode is produced on a first substrate, the method further comprising an encapsulation of the light emitting diode and a planarization of a contact surface situated above the light emitting diode, and wherein the step of producing the conversion layer comprises:

on a second substrate, producing a stack comprising said planar quantum well, placing said stack on said contact surface, in contact with said contact surface, and fixing said stack onto the contact surface, and removing the second substrate.

15. A method for manufacturing a pixel, comprising:

producing a first, second and third light emitting diodes, each configured to emit a first radiation, producing a conversion layer, which extends above the third light emitting diode and which is configured to convert a part at least of the first radiation into a third radiation, by photoluminescence, the conversion layer being delimited laterally by a lateral surface, said producing comprising:

producing at least one planar quantum well configured to emit the third radiation, and etching a diffraction grating on an upper face of the conversion layer, the diffraction grating being configured to extract a part at least of the third radiation from the conversion layer, producing a conversion layer, which extends above the second light emitting diode and which is configured to convert a part at least of the first radiation into a second radiation, by photoluminescence, the conversion layer being delimited laterally by a lateral surface, said producing comprising:

producing at least one planar quantum well configured to emit the second radiation, and etching a diffraction grating on an upper face of the conversion layer, the diffraction grating being configured to extract a part at least of the second radiation from the conversion layer, for each conversion layer, producing a lateral reflector having a reflective surface which extends transversally with respect to the conversion layer considered, facing a part at least of the lateral surface of said conversion layer, the reflective surface of the reflector and the lateral surface of the conversion layer considered being separated from each other by a material having an optical index $n_2$, and wherein a distance separating the reflective surface of the reflector from the lateral surface of the conversion layer considered is comprised between $\lambda/(n_2 \times 40)$ and $\lambda/(n_2 \times 2)$ where $\lambda$ is the average wavelength of the second radiation, or, respectively of the third radiation.

16. The device of claim 1, wherein the distance separating the reflective surface of the reflector from the lateral surface of the conversion layer is selected to avoid plasmonic coupling with a material of reflective surface of the reflector.

17. The device of claim 1, wherein the device is constructed such that at least part of the second radiation propagates in the conversion layer parallel to its upper face in the form of a guided propagation mode.

* * * * *